(12) United States Patent
Ota et al.

(10) Patent No.: US 9,275,729 B2
(45) Date of Patent: Mar. 1, 2016

(54) SEMICONDUCTOR MEMORY DEVICE

(71) Applicant: Kabushiki Kaisha Toshiba, Minato-ku (JP)

(72) Inventors: Kensuke Ota, Kawasaki (JP); Masumi Saitoh, Yokkaichi (JP); Kiwamu Sakuma, Yokkaichi (JP); Daisuke Matsushita, Fujisawa (JP); Yoshihisa Iwata, Yokohama (JP); Chika Tanaka, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/491,402

(22) Filed: Sep. 19, 2014

(65) Prior Publication Data
US 2015/0213887 A1 Jul. 30, 2015

(30) Foreign Application Priority Data

Jan. 28, 2014 (JP) .................................. 2014-013830

(51) Int. Cl.
*H01L 29/66* (2006.01)
*G11C 13/00* (2006.01)
(Continued)

(52) U.S. Cl.
CPC .......... *G11C 13/0026* (2013.01); *H01L 27/249* (2013.01); *H01L 27/2436* (2013.01); *H01L 29/7869* (2013.01); *H01L 45/08* (2013.01); *H01L 45/1233* (2013.01);
(Continued)

(58) Field of Classification Search
CPC .. G11C 13/0026; H01L 45/08; H01L 45/145; H01L 27/2436; H01L 27/249; H01L 29/7869

USPC .......... 365/148; 257/5, 285; 438/63, 382, 283
See application file for complete search history.

(56) References Cited

U.S. PATENT DOCUMENTS

2008/0175032 A1 7/2008 Tanaka et al.
2009/0168480 A1 7/2009 Scheuerlein et al.
(Continued)

FOREIGN PATENT DOCUMENTS

JP 2008-181978 A 8/2008
JP 2011-66109 A 3/2011
(Continued)

OTHER PUBLICATIONS

M.J. Lee, et al., "Stack Friendly All-Oxide 3D RRAM using GaInZnO Peripheral TFT realized over Glass Substrates" IEDM Tech. Dig., 2008, pp. 85-88.

*Primary Examiner* — Long K Tran
(74) *Attorney, Agent, or Firm* — Oblon, McClelland, Maier & Neustadt, L.L.P.

(57) ABSTRACT

A semiconductor memory device comprises: first lines; second lines; memory cells; a first and second select gate transistor; and a control circuit. The first lines are arranged with a certain pitch in a first direction perpendicular to a substrate and are extending in a second direction parallel to the substrate. The second lines are arranged with a certain pitch in the second direction, are extending in the first direction, and intersect the plurality of first lines. The memory cells are disposed at intersections of the first lines and the second lines. The first and second select gate transistors each include a first or second channel line that are connected to a lower end or an upper end of the second line and a first or second gate line. The control circuit controls the first and second select gate transistors independently.

24 Claims, 42 Drawing Sheets

(51) Int. Cl.
*H01L 45/00* (2006.01)
*H01L 27/24* (2006.01)
*H01L 29/786* (2006.01)

(52) U.S. Cl.
CPC ......... *H01L 45/145* (2013.01); *G11C 13/0007* (2013.01); *G11C 2213/33* (2013.01); *G11C 2213/34* (2013.01); *G11C 2213/71* (2013.01); *G11C 2213/72* (2013.01); *G11C 2213/78* (2013.01); *G11C 2213/79* (2013.01)

(56) References Cited

U.S. PATENT DOCUMENTS

| | | |
|---|---|---|
| 2011/0062529 A1 | 3/2011 | Masuoka et al. |
| 2011/0101351 A1 | 5/2011 | Yamazaki |
| 2012/0099367 A1* | 4/2012 | Azuma et al. ................. 365/148 |
| 2012/0147649 A1* | 6/2012 | Samachisa et al. ............. 365/51 |
| 2013/0210211 A1* | 8/2013 | Vereen et al. ................. 438/382 |
| 2013/0308363 A1* | 11/2013 | Scheuerlein et al. ........... 365/63 |
| 2014/0284535 A1* | 9/2014 | Saitoh ................. H01L 27/2436 257/2 |
| 2015/0069320 A1* | 3/2015 | Rabkin et al. .................... 257/5 |

FOREIGN PATENT DOCUMENTS

| | | |
|---|---|---|
| JP | 2011-508973 A | 3/2011 |
| JP | 2011-171702 A | 9/2011 |
| WO | WO2011/043402 A1 | 4/2011 |

\* cited by examiner

SEMICONDUCTOR MEMORY DEVICE

CROSS-REFERENCE TO RELATED APPLICATIONS

This application is based upon and claims the benefit of Japanese Patent Application No. 2014-013830, filed on Jan. 28, 2014, the entire contents of which are incorporated herein by reference.

FIELD

The embodiments relate to a semiconductor memory device.

BACKGROUND

In recent years, there has been proposed a ReRAM (Resistive RAM) that utilizes as a memory a variable resistance element whose resistance value is reversibly changed. Moreover, in this ReRAM, an even higher degree of integration of a memory cell array has been made possible by a structure in which the variable resistance element is provided between a sidewall of a word line extending parallel to a substrate and a sidewall of a bit line extending perpendicularly to the substrate. In the memory cell array of such a structure, a select gate transistor is connected to a lower end of the bit line, and each of the bit lines is selectively connected to a global bit line by this select gate transistor.

The semiconductor memory device according to the embodiments lowers power consumption.

DETAILED DESCRIPTION

A semiconductor memory device according to an embodiment comprises: a plurality of first lines; a plurality of second lines; a plurality of memory cells; a first select gate transistor; a first global bit line; a second select gate transistor; a second global bit line; and a control circuit. The plurality of first lines are arranged with a certain pitch in a first direction perpendicular to a substrate and are extending in a second direction parallel to the substrate. The plurality of second lines are arranged with a certain pitch in the second direction, extending in the first direction, and intersect the plurality of first lines. The plurality of memory cells are disposed at intersections of the plurality of first lines and the plurality of second lines. A plurality of the first select gate transistors each include a first channel line connected to a lower end of the second line and a first gate line. The first global bit line is connected to the plurality of first channel lines. A plurality of the second select gate transistors each include a second channel line connected to an upper end of the second line and a second gate line. The second global bit line is connected to the plurality of second channel lines. The control circuit applies a voltage to the plurality of memory cells. In addition, this control circuit controls the first select gate transistor and the second select gate transistor independently.

Hereinafter, semiconductor memory devices according to embodiments are described with reference to the accompanying drawings.

First Embodiment

Configuration

Figure 1:
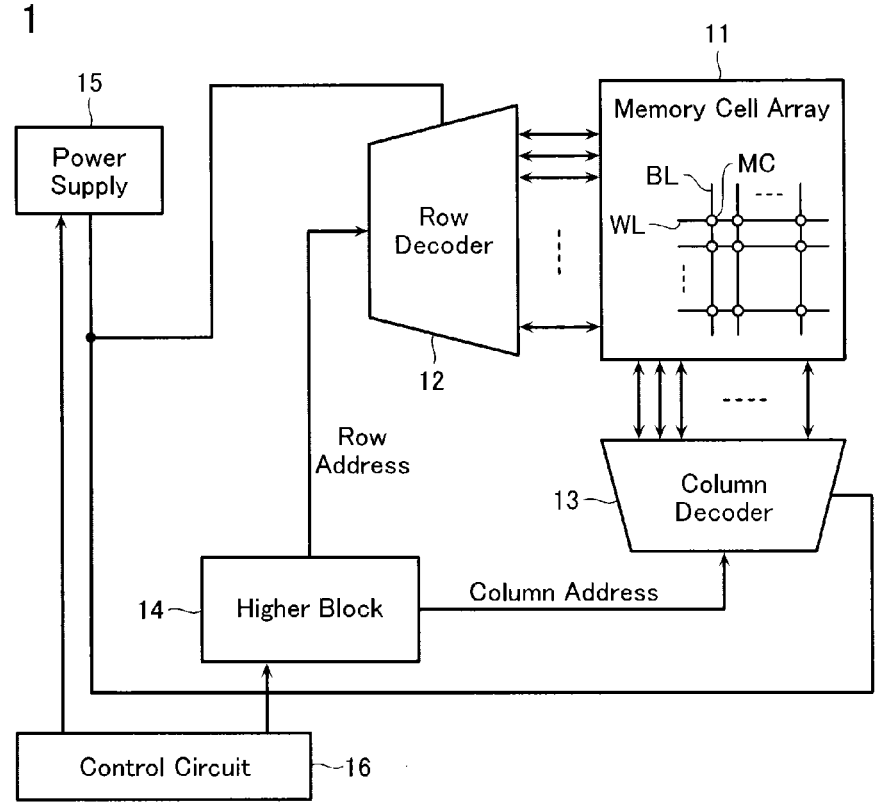
FIG. 1 is an example of a block diagram of a semiconductor memory device according to a first embodiment.

First, an overall configuration of a semiconductor memory device according to a first embodiment will be described. FIG. 1 is an example of a block diagram of the semiconductor memory device according to the first embodiment. As shown in FIG. 1, the semiconductor memory device includes a memory cell array 11, a row decoder 12, a column decoder 13, a higher block 14, a power supply 15, and a control circuit 16.

The memory cell array 11 includes a plurality of word lines WL and bit lines BL that intersect each other, and memory cells MC disposed at each of intersections of these word lines WL and bit lines BL. The row decoder 12 selects the word line WL during access (data erase/write/read). The column decoder 13 selects the bit line BL during the access, and includes a driver that controls an access operation.

The higher block 14 selects the memory cell MC which is to be an access target in the memory cell array 11. The higher block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of, for example, sending the addresses to the higher block 14, and, moreover, performs control of the power supply 15, based on a command from external.

Figure 2:
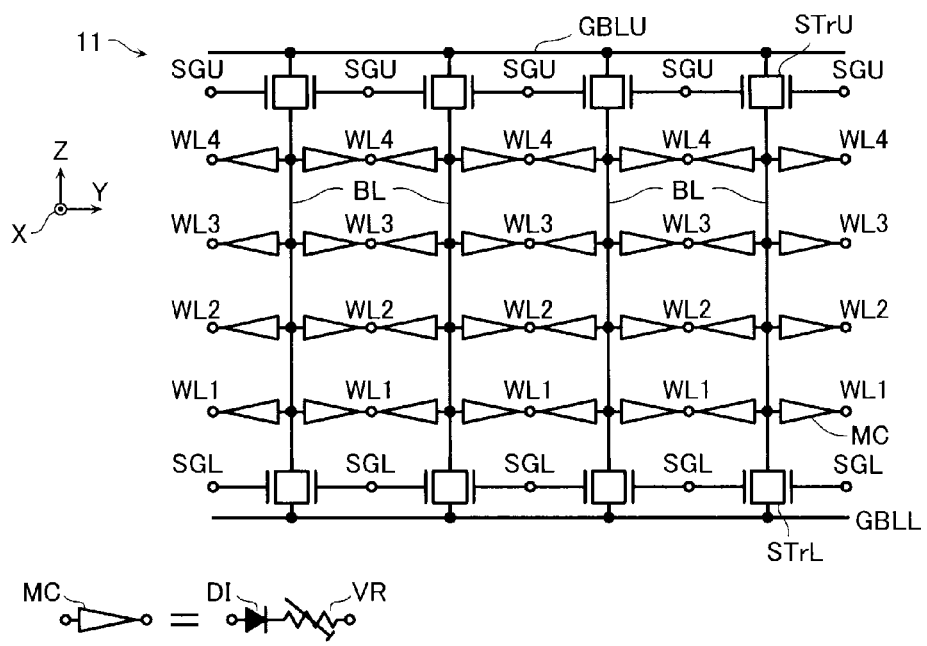
FIG. 2 is an example of a circuit diagram of a memory cell array 11 of the same semiconductor memory device.

Next, the memory cell array 11 according to the first embodiment will be described in detail with reference to FIG. 2. FIG. 2 is an example of a circuit diagram of the memory cell array 11. Note that in FIG. 2, an X direction, a Y direction, and a Z direction are orthogonal to each other, and the X direction is a direction perpendicular to a plane of paper. In addition, a structure shown in FIG. 2 is provided repeatedly in the X direction.

As shown in FIG. 2, the memory cell array 11 includes a lower select transistor STrL, a lower global bit line GBLL, a lower select gate line SGL, an upper select transistor STrU, an upper global bit line GBLU, and an upper select gate line SGU, in addition to the above-mentioned word lines WL (WL1 to WL4), bit lines BL, and memory cells MC.

As shown in FIG. 2, the word lines WL1 to WL4 are arranged in the Z direction with a certain pitch, and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 2, the memory cell MC includes a variable resistance element VR and a rectifier element DI. The rectifier element DI is a non-linear element such as a diode or transistor that rectifies a current direction from a bit line BL side to a word line WL side. A resistance value of the variable resistance element VR changes between a high-resistance state and a low-resistance state based on an applied voltage, whereby the memory cell MC stores data in a nonvolatile manner based on that resistance value.

The variable resistance element VR changes from the high-resistance state (reset state) to the low-resistance state (set state) by a setting operation that applies a certain constant voltage or more to both ends of the variable resistance element VR, and changes from the low-resistance state (set state) to the high-resistance state (reset state) by a resetting operation that applies a certain constant voltage or more to both ends of the variable resistance element VR. The resetting operation is performed by applying a voltage in a reverse direction to a direction in which a voltage is applied in the setting operation, for example. In addition, the variable resistance element VR, immediately after manufacturing, is in a state where its resistance state is not easily changed, and is in the high-resistance state. Accordingly, a forming operation is executed. In the forming operation, a high voltage greater than or equal to that of the setting operation and the resetting operation is applied to both ends of the variable resistance element VR. As a result of this forming operation, a region where locally it is easy for a current to flow (filament path) is formed in the variable resistance element VR, whereby the variable resistance element VR can have its resistance state changed easily, and achieves a state of being operable as a storage element.

As shown in FIG. 2, the lower select transistor STrL is provided between the lower global bit line GBLL and a lower end of the bit line BL. The lower global bit lines GBLL are aligned with a certain pitch in the X direction, and extend in the Y direction. One lower global bit line GBLL is commonly connected to lower ends of a plurality of the lower select transistors STrL arranged in a line in the Y direction.

In addition, gate electrodes disposed between two lower select transistors STrL arranged adjacently in the Y direction can be commonly connected to those two lower select transistors STrL. The lower select gate lines SGL are aligned with a certain pitch in the Y direction, and extend in the X direction. One lower select gate line SGL is commonly connected to gates of a plurality of the lower select transistors STrL arranged in a line in the X direction. Note that it is also possible to isolate gate electrodes between two lower select transistors STrL arranged adjacently in the Y direction and thereby operate each of the two lower select transistors STrL independently.

As shown in FIG. 2, the upper select transistor STrU is provided between the upper global bit line GBLU and an upper end of the bit line BL. The upper global bit lines GBLU are aligned with a certain pitch in the X direction, and extend in the Y direction. One upper global bit line GBLU is commonly connected to upper ends of a plurality of the upper select transistors STrU arranged in a line in the Y direction.

In addition, gate electrodes disposed between two upper select transistors STrU arranged adjacently in the Y direction can be commonly connected to those two upper select transistors STrU. The upper select gate lines SGU are aligned with a certain pitch in the Y direction, and extend in the X direction. One upper select gate line SGU is commonly connected to gates of a plurality of the upper select transistors STrU arranged in a line in the X direction. Note that it is also possible to isolate gate electrodes between two upper select transistors STrU arranged adjacently in the Y direction and thereby operate each of the two upper select transistors STrU independently.

Figure 3:
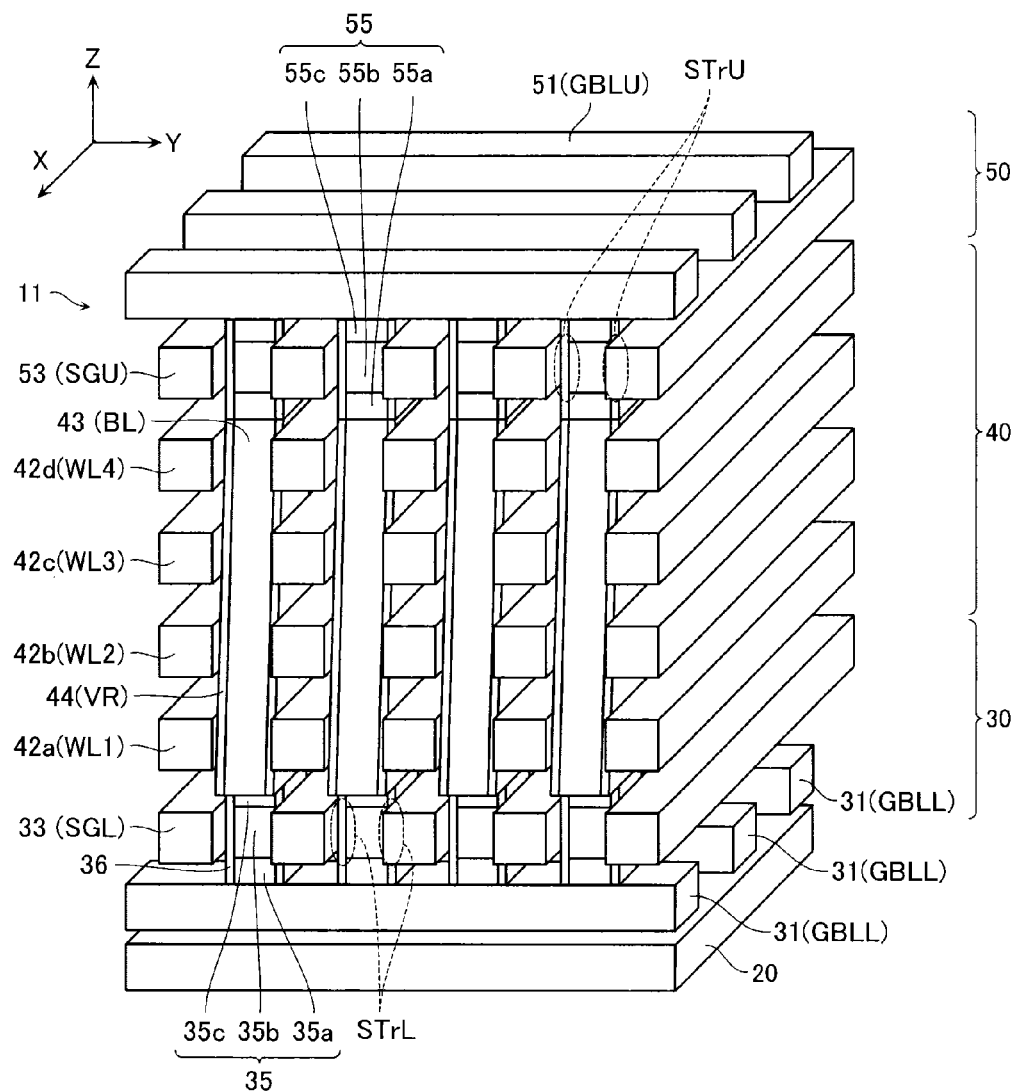
FIG. 3 is an example of a perspective view showing a stacked structure of the same memory cell array 11.
Figure 4:
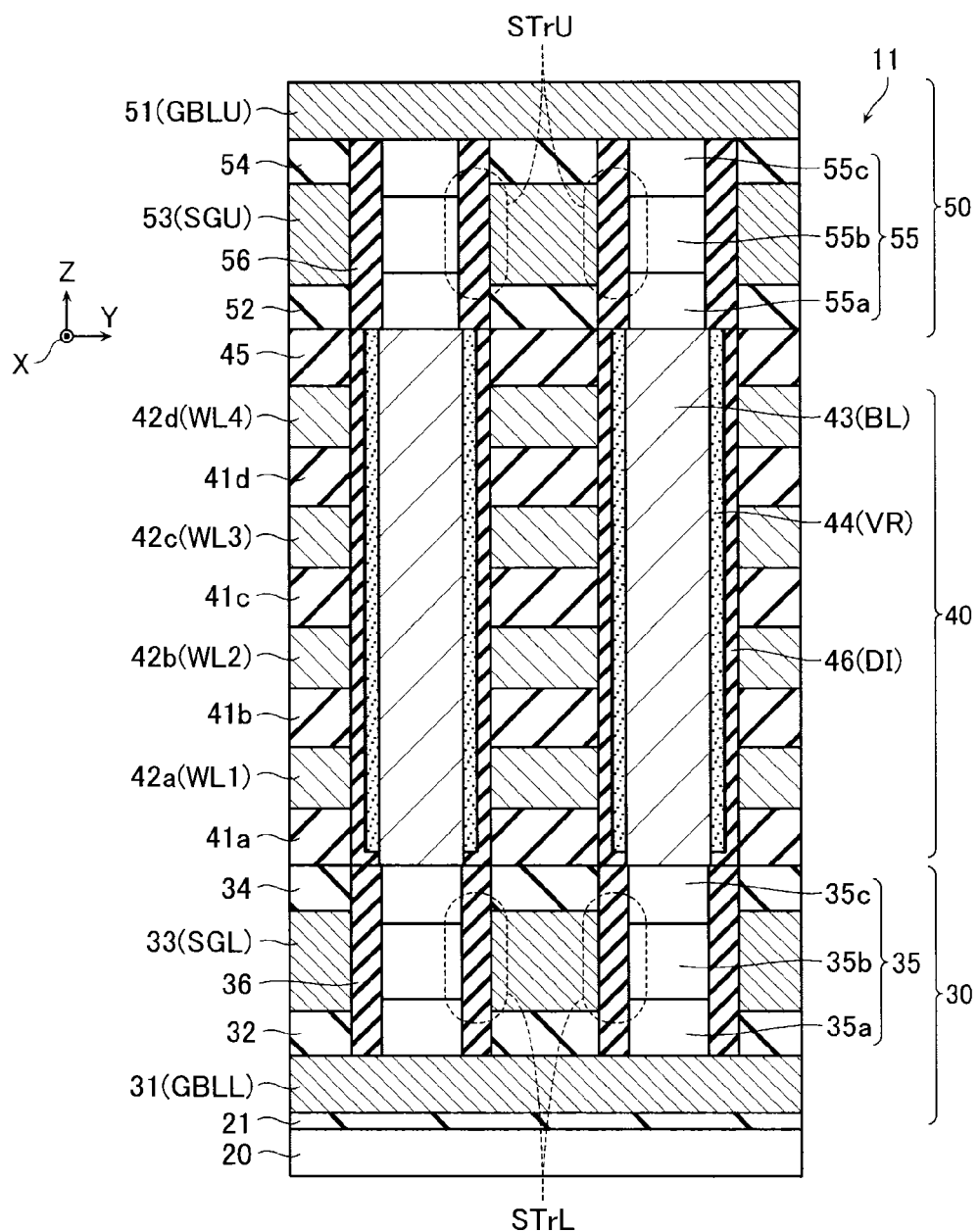
FIG. 4 is an example of a cross-sectional view looking from the X direction of FIG. 3.

Next, a stacked structure of the memory cell array 11 according to the first embodiment will be described with reference to FIGS. 3 and 4. FIG. 3 is an example of a perspective view showing the stacked structure of the memory cell array 11. FIG. 4 is an example of a cross-sectional view looking from the X direction of FIG. 3. Note that in FIG. 3, illustration of an inter-layer insulating film is omitted.

As shown in FIG. 3, the memory cell array 11 includes a lower select transistor layer 30, a memory layer 40, and an upper select transistor layer 50 that are stacked on a substrate 20. As shown in FIG. 4, an inter-layer insulating layer 21 is formed on the substrate 20. The lower select transistor layer 30 functions as the lower select transistors STrL, the memory layer 40 functions as the memory cells MC, and the upper select transistor layer 50 functions as the upper select transistors STrU.

As shown in FIG. 4, the lower select transistor layer 30 includes a conductive layer 31, an inter-layer insulating film 32, a conductive layer 33, and an inter-layer insulating film 34. As shown in FIG. 4, these conductive layer 31, inter-layer insulating film 32, conductive layer 33, and inter-layer insulating film 34 are stacked in the Z direction perpendicular to the substrate 20. The conductive layer 31 functions as the lower global bit line GBLL, and the conductive layer 33 functions as the lower select gate line SGL and as the gate of the lower select transistor STrL.

As shown in FIG. 3, the conductive layers 31 are aligned with a certain pitch in the X direction, and have a striped shape extending in the Y direction. An inter-layer insulating film not illustrated is formed between a plurality of the conductive layers 31. As shown in FIG. 4, the inter-layer insulating film 32 is formed so as to cover part of an upper surface of the conductive layer 31, and has a role of electrically insulating between the conductive layer 31 and the lower select gate line SGL (conductive layer 33). As shown in FIG. 3, the conductive layers 33 are aligned with a certain pitch in the Y direction, and are formed in a striped shape extending in the X direction. As shown in FIG. 4, the inter-layer insulating film 34 is deposited so as to cover an upper surface of the conductive layer 33. The conductive layers 31 and 33 are configured by, for example, polysilicon. The inter-layer insulating films 32 and 34 are configured by, for example, silicon oxide ($SiO_2$).

In addition, as shown in FIG. 4, the lower select transistor layer 30 includes, for example, a column-shaped semiconductor layer 35 and a gate insulating layer 36. The semiconductor layer 35 functions as a body (channel) of the lower select transistor STrL, and the gate insulating layer 36 functions as a gate insulating film of the lower select transistor STrL.

As shown in FIG. 3, the semiconductor layers 35 are disposed in a matrix in the X and Y directions, and extend in the Z direction. In addition, as shown in FIG. 4, the semiconductor layer 35 contacts the upper surface of the conductive layer 31, and contacts a side surface in the Y direction of the conductive layer 33 via the gate insulating layer 36. Moreover, as shown in FIG. 4, the semiconductor layer 35 includes an N+ type semiconductor layer 35a, a P+ type semiconductor layer 35b, and an N+ type semiconductor layer 35c stacked from below to above.

As shown in FIG. 4, the N+ type semiconductor layer 35a contacts the inter-layer insulating film 32 via the gate insulating layer 36 at a side surface in the Y direction of the N+ type semiconductor layer 35a. As shown in FIG. 4, the P+ type semiconductor layer 35b contacts a side surface of the conductive layer 33 via the gate insulating layer 36 at a side surface in the Y direction of the P+ type semiconductor layer 35b. As shown in FIG. 4, the N+ type semiconductor layer 35c contacts the inter-layer insulating film 34 via the gate insulating layer 36 at a side surface in the Y direction of the N+ type semiconductor layer 35c. The N+ type semiconductor layers 35a and 35c are configured by polysilicon implanted with an N+ type impurity, and the P+ type semiconductor layer 35b is configured by polysilicon implanted with a P+ type impurity. The gate insulating layer 36 is configured by, for example, silicon oxide ($SiO_2$).

As shown in FIG. 4, the memory layer 40 includes inter-layer insulating films 41a to 41d and conductive layers 42a to 42d stacked alternately in the Z direction, and a protective layer 45 stacked on the conductive layer 42d. The conductive layers 42a to 42d function as the word lines WL1 to WL4, respectively. The inter-layer insulating films 41a to 41d are configured by, for example, silicon oxide ($SiO_2$), and the conductive layers 42a to 42d are configured by, for example, polysilicon.

In addition, as shown in FIG. 4, the memory layer 40 includes, for example, a column-shaped conductive layer 43, a variable resistance layer 44, and a rectifier layer 46. The conductive layer 43 functions as the bit line BL. The variable resistance layer 44 functions as the variable resistance element VR. The rectifier layer 46 functions as the rectifier element DI.

As shown in FIG. 3, the conductive layers 43 are disposed in a matrix in the X and Y directions, contact an upper surface of the semiconductor layer 35 at a lower end of the conductive layer 43, and extend in a columnar shape in the Z direction. As shown in FIG. 4, the variable resistance layer 44 and the rectifier layer 46 are provided between a side surface in the Y direction of the conductive layer 43 and side surfaces in the Y direction of the inter-layer insulating films 41a to 41d. In addition, as shown in FIG. 4, the variable resistance layer 44 and the rectifier layer 46 are provided between the side surface in the Y direction of the conductive layer 43 and side surfaces in the Y direction of the conductive layers 42a to 42d.

In the present embodiment, the conductive layer 43 is configured by, for example, polysilicon, and the variable resistance layer 44 is configured by, for example, a metal oxide (for example, $HfO_x$, $Al_2O_x$, $TiO_x$, $NiO_x$, $WO_x$, $Ta_2O_x$, and so on). However, it is also possible for the variable resistance layer 44 to be configured from the likes of a stacked film of a silicon oxide film and an ion source metal, for example. The rectifier layer 46 is configured by, for example, silicon oxide ($SiO_2$).

As shown in FIG. 4, the upper select transistor layer 50 includes an inter-layer insulating film 52, a conductive layer 53, and an inter-layer insulating film 54. As shown in FIG. 4, these inter-layer insulating film 52, conductive layer 53, and inter-layer insulating film 54 are stacked in the Z direction. The conductive layer 53 functions as the upper select gate line SGU and as the gate of the upper select transistor STrU.

As shown in FIG. 4, the inter-layer insulating film 52 is formed on an upper surface of the protective layer 45, and, together with the protective layer 45, electrically insulates between the conductive layer 42d and the upper select gate line SGU (conductive layer 53). As shown in FIG. 3, the conductive layers 53 are aligned with a certain pitch in the Y direction, and are formed in a striped shape extending in the X direction. As shown in FIG. 4, the inter-layer insulating film 54 is deposited so as to cover part of an upper surface of the conductive layer 53. The conductive layer 53 is configured by, for example, polysilicon. The inter-layer insulating films 52 and 54 are configured by, for example, silicon oxide ($SiO_2$).

In addition, as shown in FIG. 4, the upper select transistor layer 50 includes, for example, a column-shaped semiconductor layer 55 and a gate insulating layer 56. The semiconductor layer 55 functions as a body (channel) of the upper select transistor STrU, and the gate insulating layer 56 functions as a gate insulating film of the upper select transistor STrU.

As shown in FIG. 3, the semiconductor layers 55 are disposed in a matrix in the X and Y directions, and extend in the Z direction. In addition, as shown in FIG. 4, the semiconductor layer 55 contacts the upper surface of the conductive layer 43, and contacts a side surface in the Y direction of the conductive layer 53 via the gate insulating layer 56. Moreover, as shown in FIG. 4, the semiconductor layer 55 includes an N+ type semiconductor layer 55a, a P+ type semiconductor layer 55b, and an N+ type semiconductor layer 55c stacked from below to above.

As shown in FIG. 4, the N+ type semiconductor layer 55a contacts the inter-layer insulating film 52 via the gate insulating layer 56 at a side surface in the Y direction of the N+ type semiconductor layer 55a. As shown in FIG. 4, the P+ type semiconductor layer 55b contacts a side surface of the conductive layer 53 via the gate insulating layer 56 at a side surface in the Y direction of the P+ type semiconductor layer 55b. As shown in FIG. 4, the N+ type semiconductor layer 55c contacts the inter-layer insulating film 54 via the gate insulating layer 56 at a side surface in the Y direction of the N+ type semiconductor layer 55c. The N+ type semiconductor layers 55a and 55c are configured by polysilicon implanted with an N+ type impurity, and the P+ type semiconductor layer 55b is configured by polysilicon implanted with a P+ type impurity. The gate insulating layer 56 is configured by, for example, silicon oxide ($SiO_2$).

Furthermore, as shown in FIG. 4, the upper select transistor layer 50 includes a conductive layer 51. The conductive layer 51 functions as the upper global bit line GBLU. As shown in FIG. 3, the conductive layers 51 are aligned with a certain pitch in the X direction parallel to the substrate 20, and have a striped shape extending in the Y direction. Moreover, as shown in FIG. 3, the conductive layer 51 contacts upper surfaces of a plurality of the semiconductor layers 55 adjacent in the Y direction. The conductive layer 51 is configured by, for example, polysilicon. An inter-layer insulating film not illustrated is formed between a plurality of the conductive layers 51.

[Write Operation]

Figure 5:
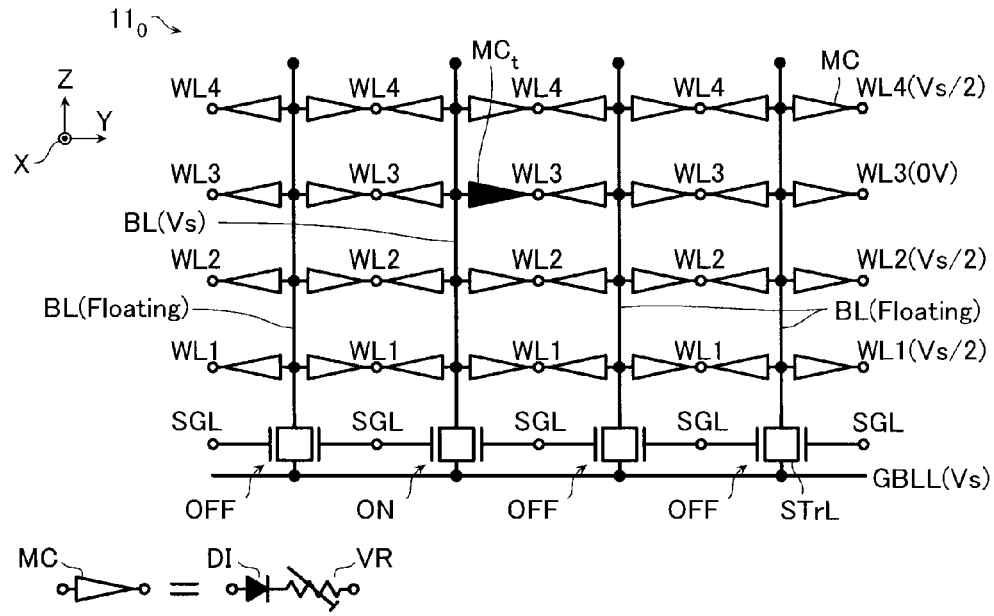
FIG. 5 is a circuit diagram for explaining a write operation of a memory cell array $11_0$ of a semiconductor memory device according to a comparative example.

Next, a write operation of the semiconductor memory device according to the first embodiment will be described while contrasting with a comparative example. FIG. 5 is a circuit diagram for explaining a write operation of a memory cell array $11_0$ of a semiconductor memory device according to a comparative example. The memory cell array $11_0$ is configured substantially similarly to the memory cell array 11 of the semiconductor memory device according to the present embodiment, but differs in not including the upper select transistor STrU, the upper global bit line GBLU, and the upper select gate line SGU.

As shown in FIG. 5, when performing a write operation in the semiconductor memory device according to the comparative example, a voltage of the lower global bit line GBLL is set to a setting voltage Vs, for example. In addition, a certain lower select transistor STrL is set to an ON state, and the other lower select transistors STrL are set to an OFF state. As a result, the setting voltage Vs is transferred to a bit line BL connected to a selected memory cell $MC_t$ which is a target of the write operation (selected bit line), and bit lines BL other than the selected bit line BL (unselected bit lines) attain a floating state. Furthermore, a voltage of the word line WL3 connected to the selected memory cell $MC_t$ (selected word line) is set to about 0 V, and voltages of the other word lines WL1, WL2, and WL4 (unselected word lines) are set to Vs/2. As a result, a voltage is applied between a negative electrode and a positive electrode of the selected memory cell $MC_t$, and the write operation is performed.

Now, in the semiconductor memory device according to the present comparative example, the bit lines BL other than the selected bit line BL (unselected bit lines) during the write operation are in a floating state. Therefore, a potential difference occurs between the unselected word lines WL and the unselected bit lines BL and a leak current sometimes occurs.

Figure 6A:
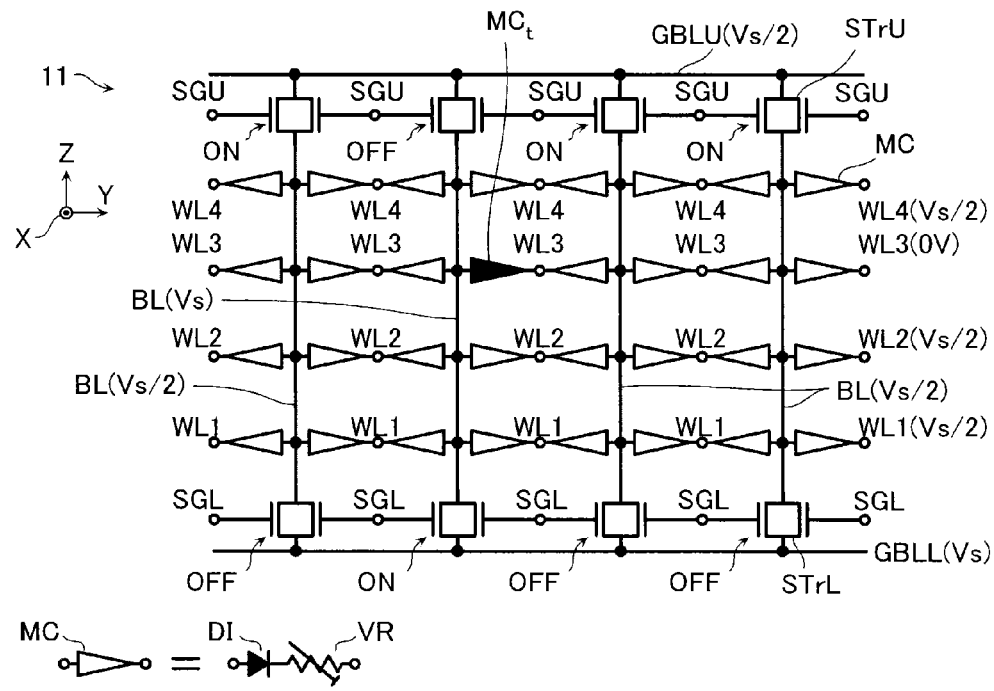
FIG. 6A is a circuit diagram for explaining a write operation of the semiconductor memory device according to the first embodiment.

Next, operation of the semiconductor memory device according to the first embodiment will be described with reference to FIG. 6A. FIG. 6A is a circuit diagram for explaining the write operation of the semiconductor memory device according to the first embodiment.

When performing the write operation in the semiconductor memory device according to the present embodiment, the voltages of the lower global bit line GBLL, the lower select transistors STrL, and the word lines WL1 to WL4 are controlled similarly to in the above-described comparative example. Furthermore, in the present embodiment, a voltage of the upper global bit line GBLU is set to Vs/2, for example. Moreover, the upper select transistors STrU connected to the unselected bit lines BL are set to an ON state, and Vs/2 is transferred to the unselected bit lines BL. Note that the upper select transistor STrU connected to the selected bit line BL is set to an OFF state.

In the semiconductor memory device according to the present embodiment, the unselected bit lines BL and the unselected word lines WL1, WL2, and WL4 are each applied with Vs/2. Therefore, a leak current does not occur between these wiring lines, and it is possible to lower power consumption during the write operation and suppress incorrect operation.

Figure 6B:
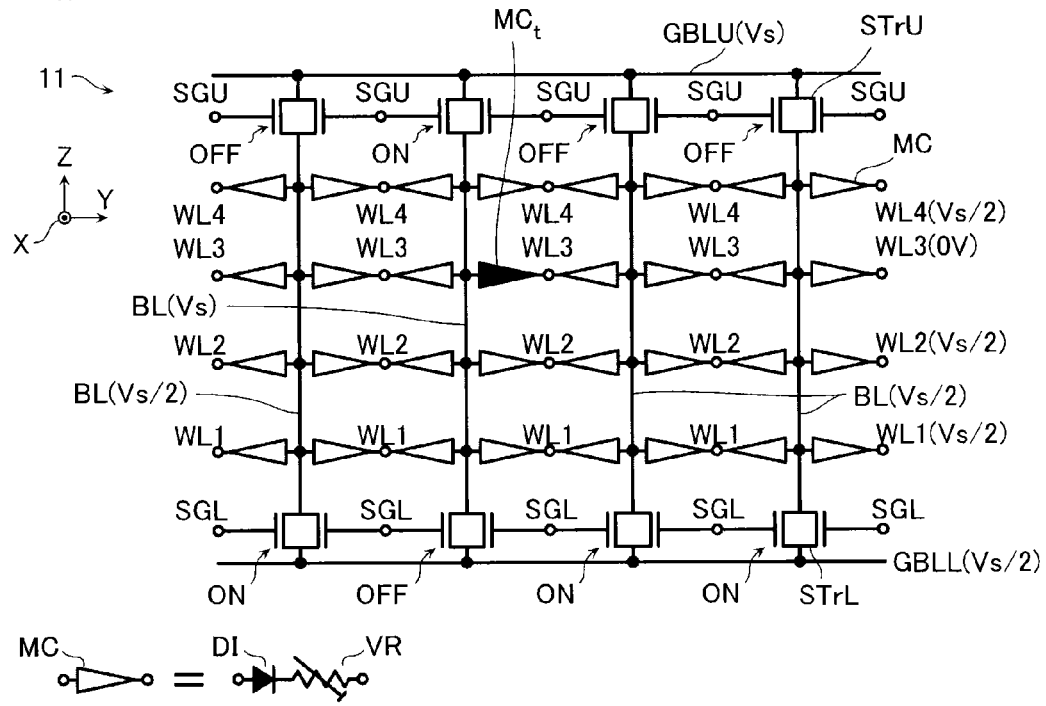
FIG. 6B is a circuit diagram for explaining another mode of the same write operation.

Next, another mode of operation of the semiconductor memory device according to the first embodiment will be described with reference to FIG. 6B. FIG. 6B is a circuit diagram for explaining another mode of the write operation of the semiconductor memory device according to the first embodiment.

As shown in FIG. 6B, in the semiconductor memory device according to the present embodiment, it is also possible for the voltage of the upper global bit line GBLU to be set to the setting voltage Vs, the upper select transistor STrU connected to the selected bit line BL to be set to an ON state, and the upper select transistors STrU connected to the unselected bit lines BL to be set to an OFF state. In this case, the voltage of the lower global bit line GBLL is set to Vs/2, the lower select transistors STrL connected to the unselected bit lines BL are set to an ON state, and the lower select transistor STrL connected to the selected bit line BL is set to an OFF state.

In other words, the control circuit 16 sets one of the lower select transistor STrL and the upper select transistor STrU connected to the selected bit line BL to an ON state and the other to an OFF state. Moreover, as shown in FIG. 6A, when the lower select transistor STrL connected to the selected bit line BL is set to an ON state, the control circuit 16 sets the lower select transistors STrL connected to the unselected bit lines BL to an OFF state, and sets the upper select transistors STrU connected to the unselected bit lines BL to an ON state. On the other hand, as shown in FIG. 6B, when the upper select transistor STrU connected to the selected bit line BL is set to an ON state, the control circuit 16 sets the lower select transistors STrL connected to the unselected bit lines BL to an ON state, and sets the upper select transistors STrU connected to the unselected bit lines BL to an OFF state.

[Manufacturing Method]

Next, a manufacturing method of the semiconductor memory device according to the present embodiment will be described with reference to FIGS. 7 to 26. FIGS. 7, 10 to 18, and 21 to are examples of cross-sectional views showing the manufacturing method of the memory cell array 11. FIGS. 8, 9, 19, 20, and 26 are examples of plan views showing the same manufacturing method.

Figure 7:
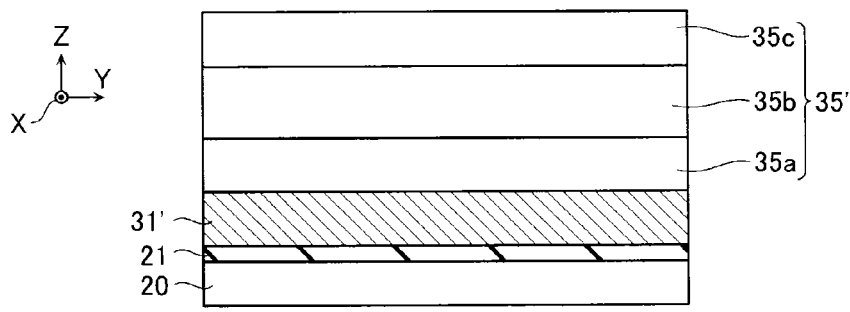
FIG. 7 is an example of a cross-sectional view showing a manufacturing method of the memory cell array 11 of the semiconductor memory device according to the first embodiment.

As shown in FIG. 7, a conductive layer 31' and a semiconductor layer 35' (35a, 35b, and 35c) are stacked on the substrate 20 via the inter-layer insulating layer 21.

Figure 8:
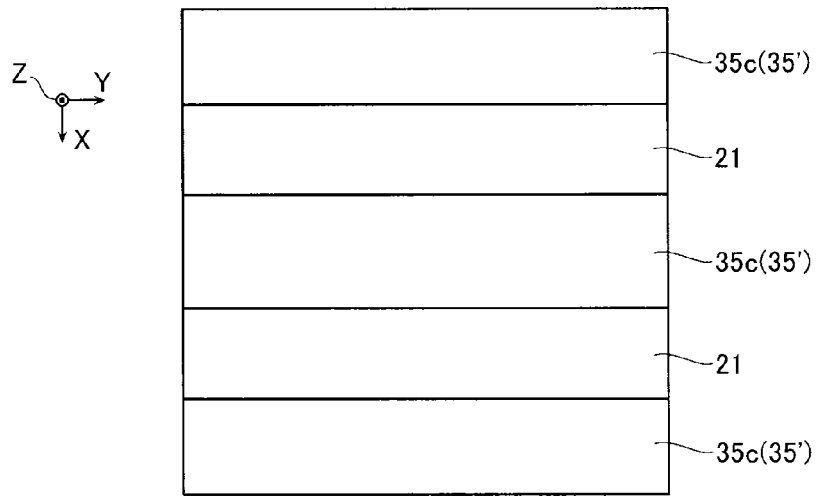
FIG. 8 is an example of a plan view showing the same manufacturing method.

Next, as shown in FIG. 8, trenches that penetrate the conductive layer 31' and the semiconductor layer 35' and that are arranged with a certain pitch in the X direction and extend in the Y direction, are formed. This trench results in the conductive layer 31' becoming the conductive layers 31 extending in a striped shape in the Y direction.

Figure 9:
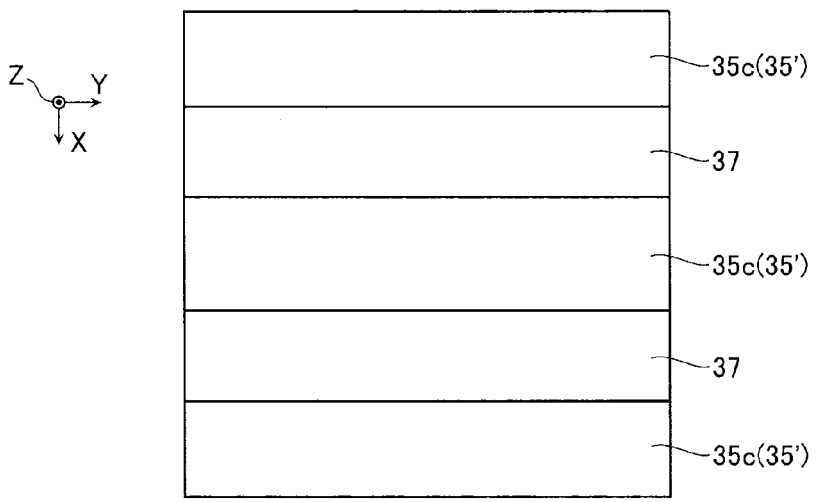
FIG. 9 is an example of a plan view showing the same manufacturing method.

Next, as shown in FIG. 9, an exposed upper surface of the inter-layer insulating layer 21 and exposed sidewalls of the semiconductor layer 35' are filled in by an inter-layer insulating film 37.

Figure 10:
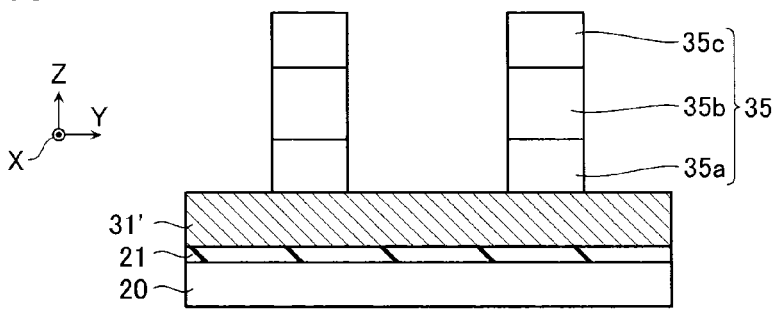
FIG. 10 is an example of a cross-sectional view showing the same manufacturing method.

Next, as shown in FIG. 10, trenches that penetrate the semiconductor layer 35' and that are arranged with a certain pitch in the Y direction and extend in the X direction, are formed. This trench results in the semiconductor layer 35' becoming the semiconductor layers 35 aligned in a matrix in the X direction and the Y direction.

Figure 11:
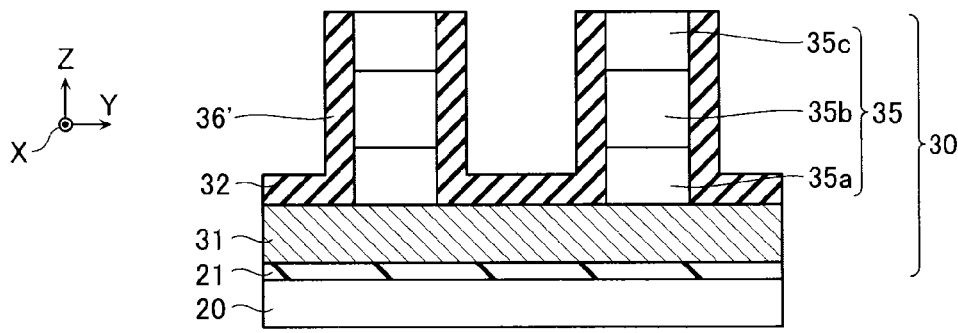
FIG. 11 is an example of a cross-sectional view showing the same manufacturing method.
Figure 12:
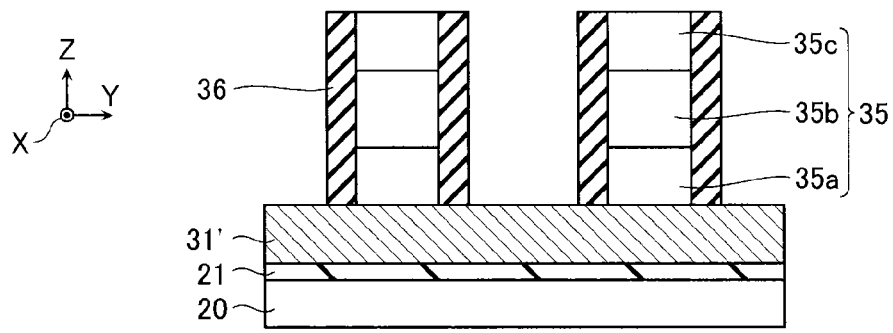
FIG. 12 is an example of a cross-sectional view showing the same manufacturing method.

Next, as shown in FIG. 11, an insulating layer 36' that forms the gate insulating layer 36 is formed on side surfaces and a bottom surface of the trench. Next, as shown in FIG. 12, the insulating layer 36' formed on the bottom surface of the trench is removed to form the gate insulating layer 36.

Figure 13:
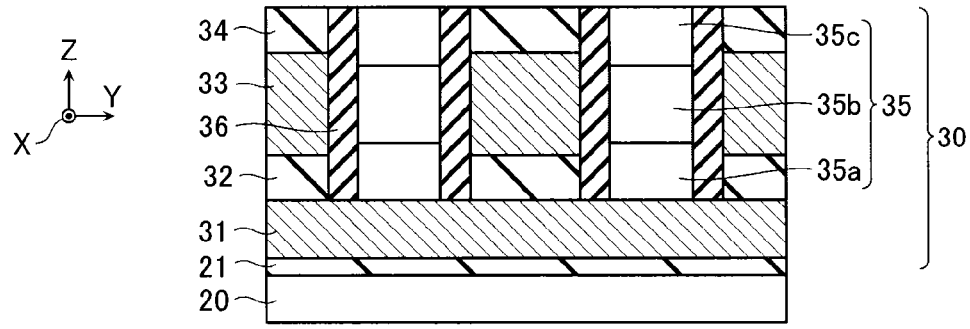
FIG. 13 is an example of a cross-sectional view showing the same manufacturing method.

Next, as shown in FIG. 13, the inter-layer insulating film 32, the conductive layer 33, and the inter-layer insulating film are stacked sequentially on an upper surface of the conductive layer 31 so as to fill the trench. Next, heat treatment is performed, and polysilicon of the semiconductor layer 35 is crystallized. Steps thus far result in the lower select transistor layer 30 being formed.

Figure 14:
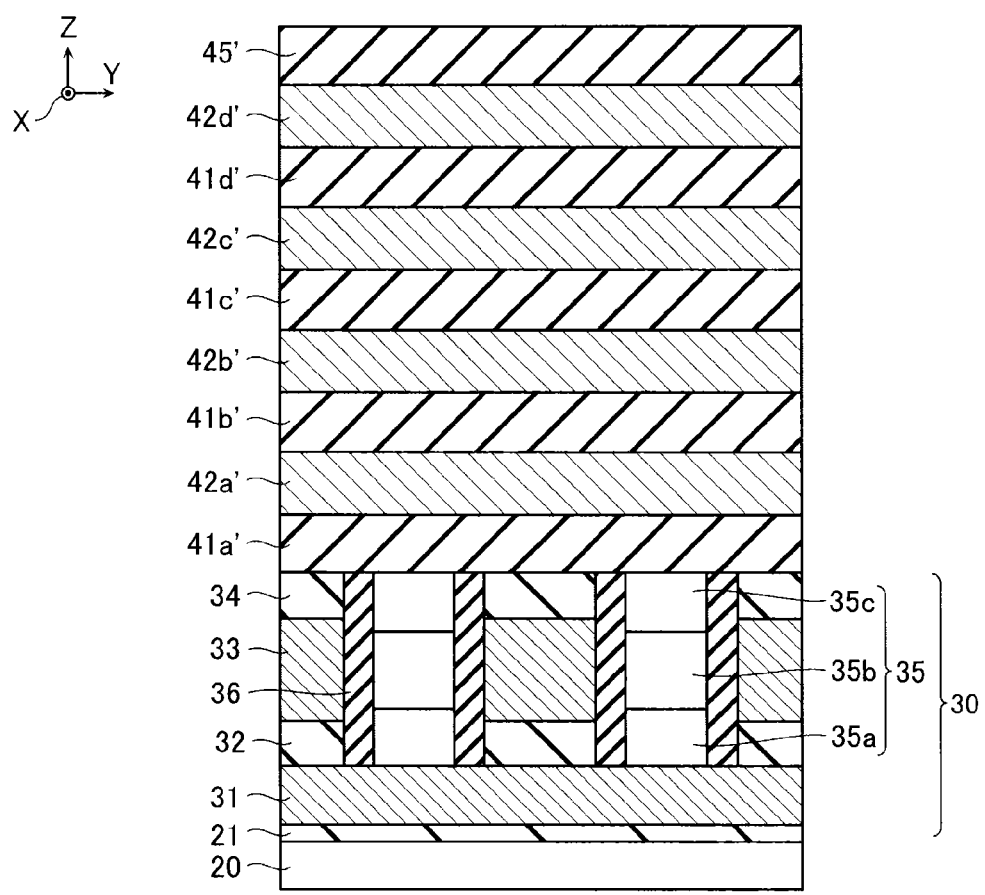
FIG. 14 is an example of a cross-sectional view showing the same manufacturing method.

Next, as shown in FIG. 14, silicon oxide ($SiO_2$) and polysilicon (Si) are stacked alternately on an upper surface of the lower select transistor layer 30 to form inter-layer insulating layers 41a' to 41d' and conductive layers 42a' to 42d' that extend in a plate-like shape in the X direction and the Y direction. In addition, a protective layer 45' is formed on the conductive layer 42d'.

Figure 15:
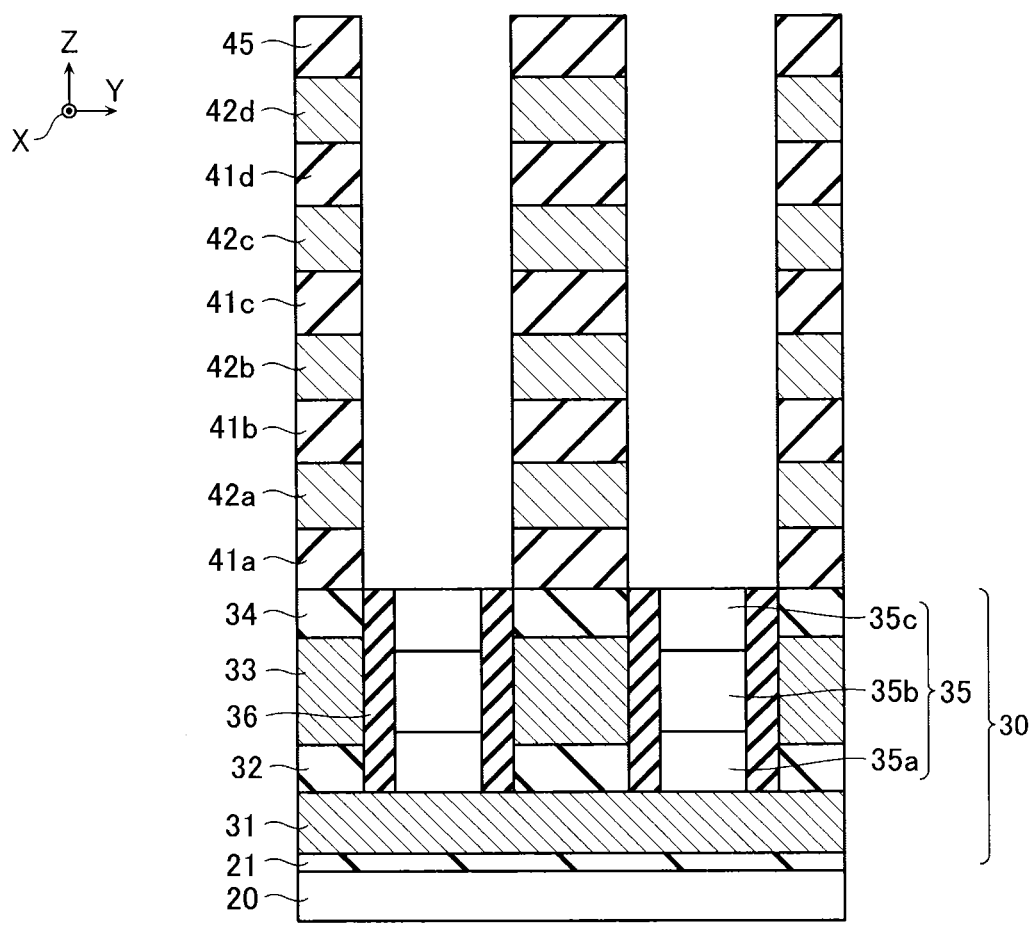
FIG. 15 is an example of a cross-sectional view showing the same manufacturing method.

Next, as shown in FIG. 15, trenches that penetrate the inter-layer insulating layers 41a' to 41d', the conductive layers 42a' to 42d', and the protective layer 45', and that are arranged with a certain pitch in the Y direction and extend in the X direction, are formed. This trench results in the inter-layer insulating layers 41a' to 41d', the conductive layers 42a' to 42d', and the protective layer 45' becoming the inter-layer insulating layers 41a to 41d, the conductive layers 42a to 42d, and the protective layers 45 extending in a striped shape in the X direction.

Figure 16:
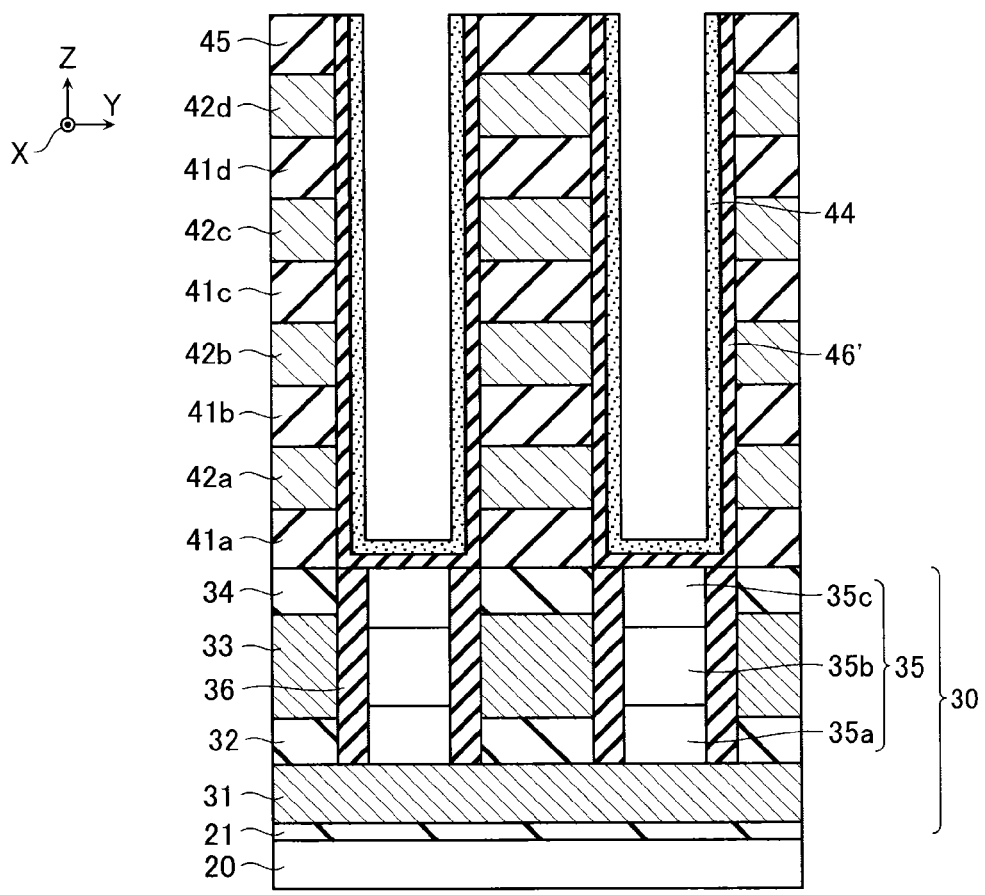
FIG. 16 is an example of a cross-sectional view showing the same manufacturing method.

Next, as shown in FIG. 16, an insulating layer 46' that forms the rectifier layer 46 and the variable resistance layer 44 are formed sequentially on side surfaces and a bottom surface of the trench. In the present embodiment, a film thickness of the variable resistance layer 44 is about several nm. The variable resistance layer 44 is formed by depositing a metal oxide by atomic layer deposition (ALD), for example.

Figure 17:
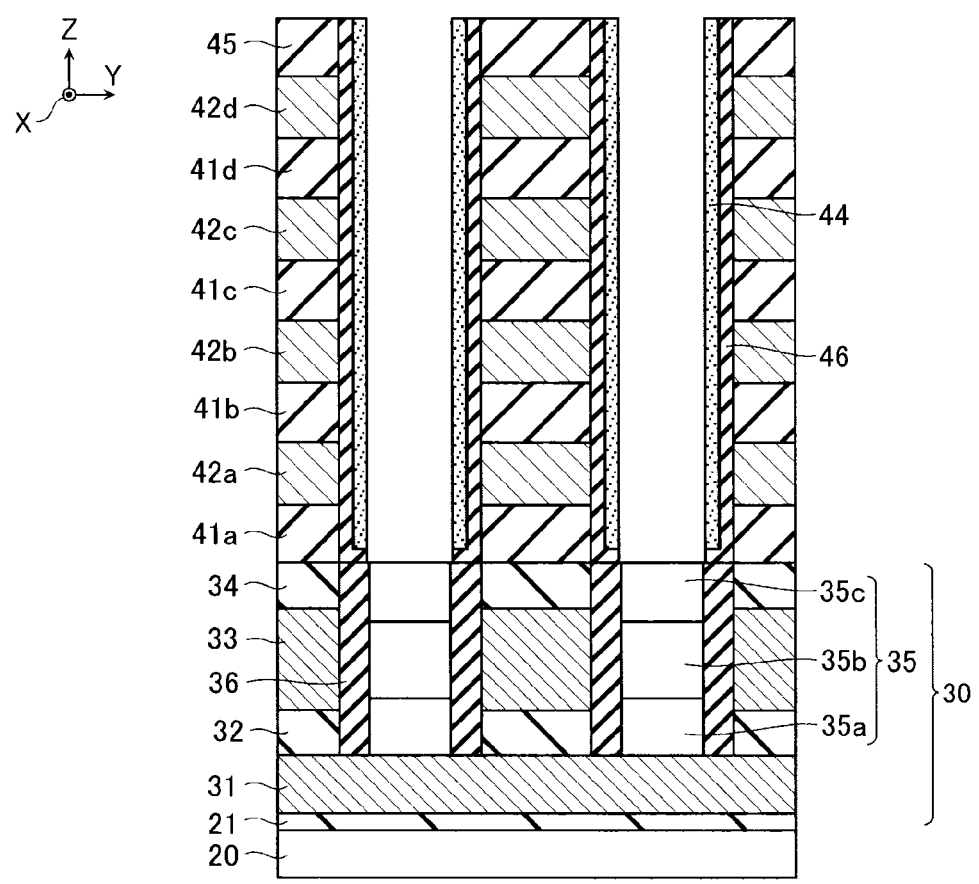
FIG. 17 is an example of a cross-sectional view showing the same manufacturing method.
Figure 18:
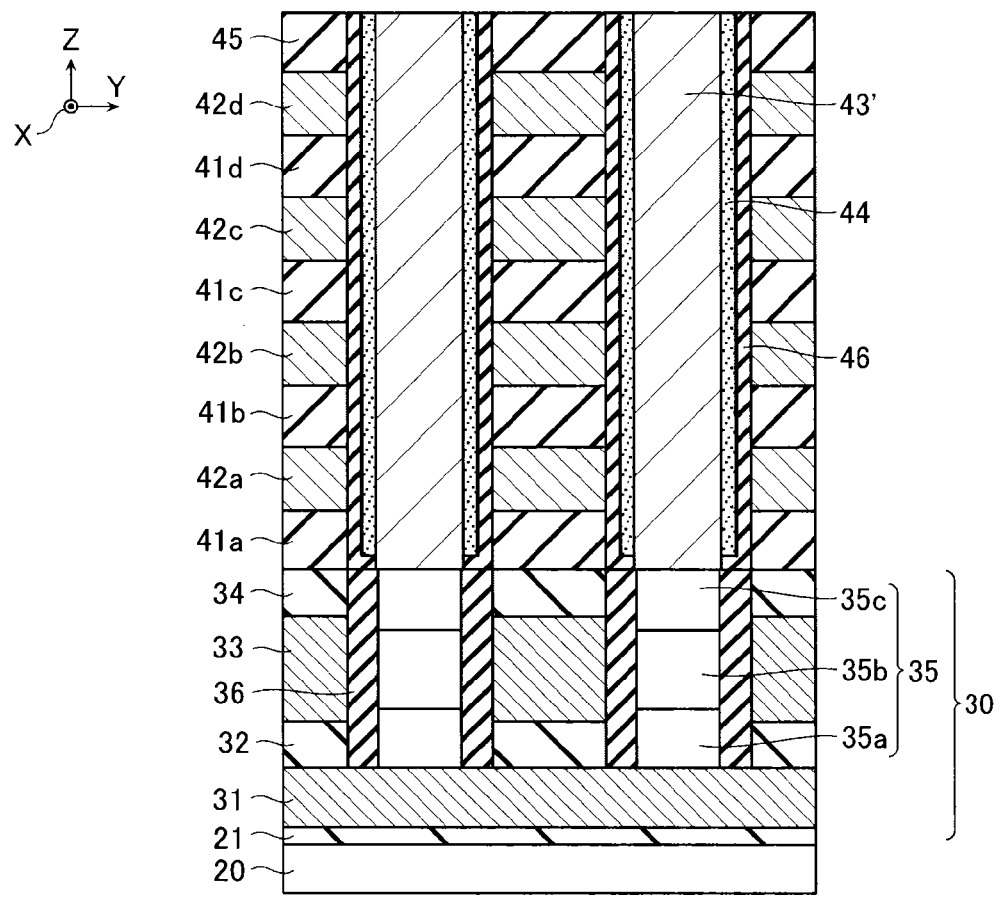
FIG. 18 is an example of a cross-sectional view showing the same manufacturing method.

Next, as shown in FIG. 17, the insulating layer 46' and the variable resistance layer 44 formed on the bottom surface of the trench are removed, and the rectifier layer 46 and the variable resistance layer 44 are formed on the entire side surface of the trench. Next, as shown in FIG. 18, a conductive layer 43' is formed so as to fill the trench.

Figure 19:
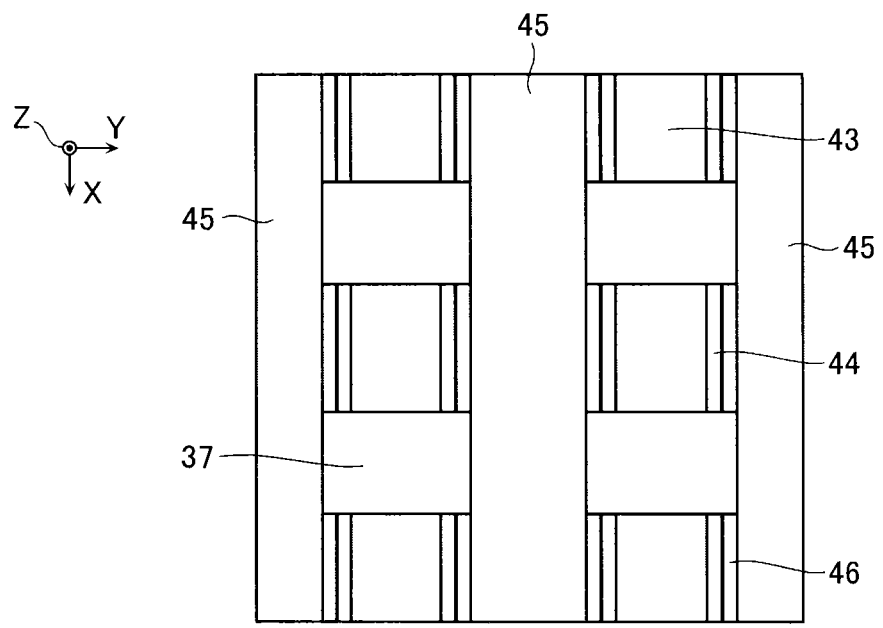
FIG. 19 is an example of a plan view showing the same manufacturing method.

Following this, as shown in FIG. 19, RIE (Reactive Ion Etching) is performed on the conductive layer 43' to form trenches that penetrate the conductive layer 43'. The trenches can be arranged with a certain pitch in the X direction by employing lithography technology. This trench results in the conductive layer 43' becoming the conductive layers 43 aligned in a matrix in the X direction and the Y direction.

Figure 20:
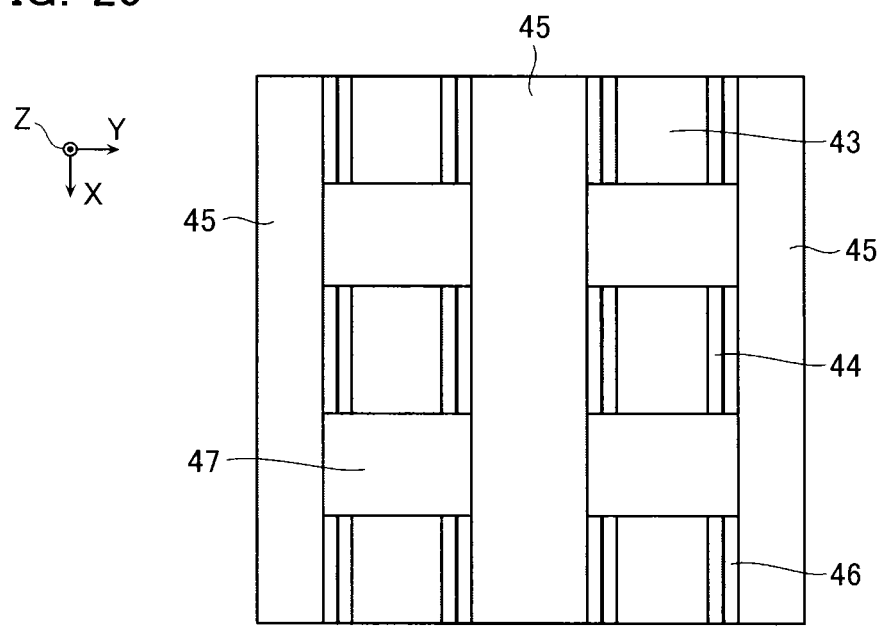
FIG. 20 is an example of a plan view showing the same manufacturing method.

Next, as shown in FIG. 20, silicon oxide ($SiO_2$) is deposited in the trench by a film formation method of high isotropy such as an ALD method or CVD method to form an inter-layer insulating layer 47 in the trench. Steps thus far result in the memory layer 40 being formed.

Figure 21:
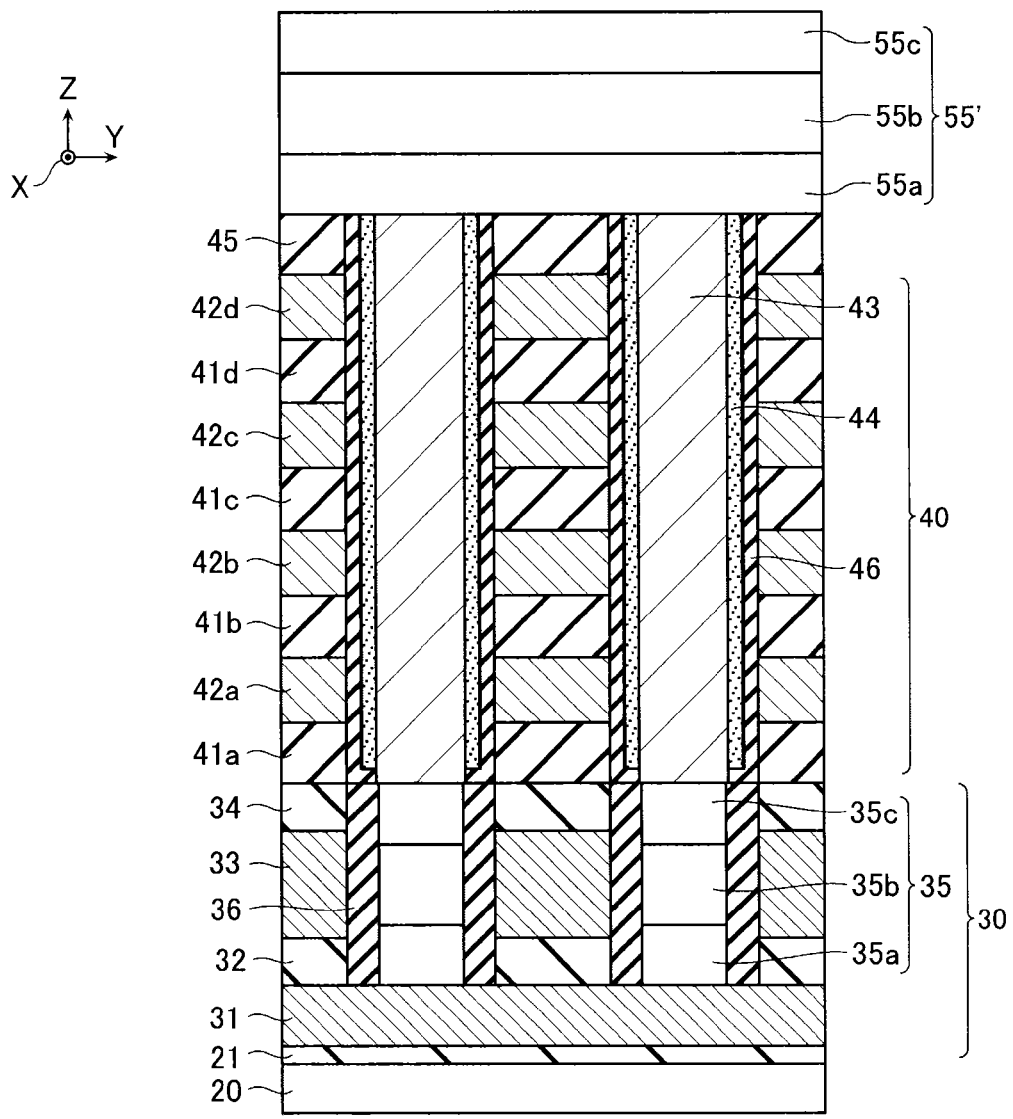
FIG. 21 is an example of a cross-sectional view showing the same manufacturing method.
Figure 22:
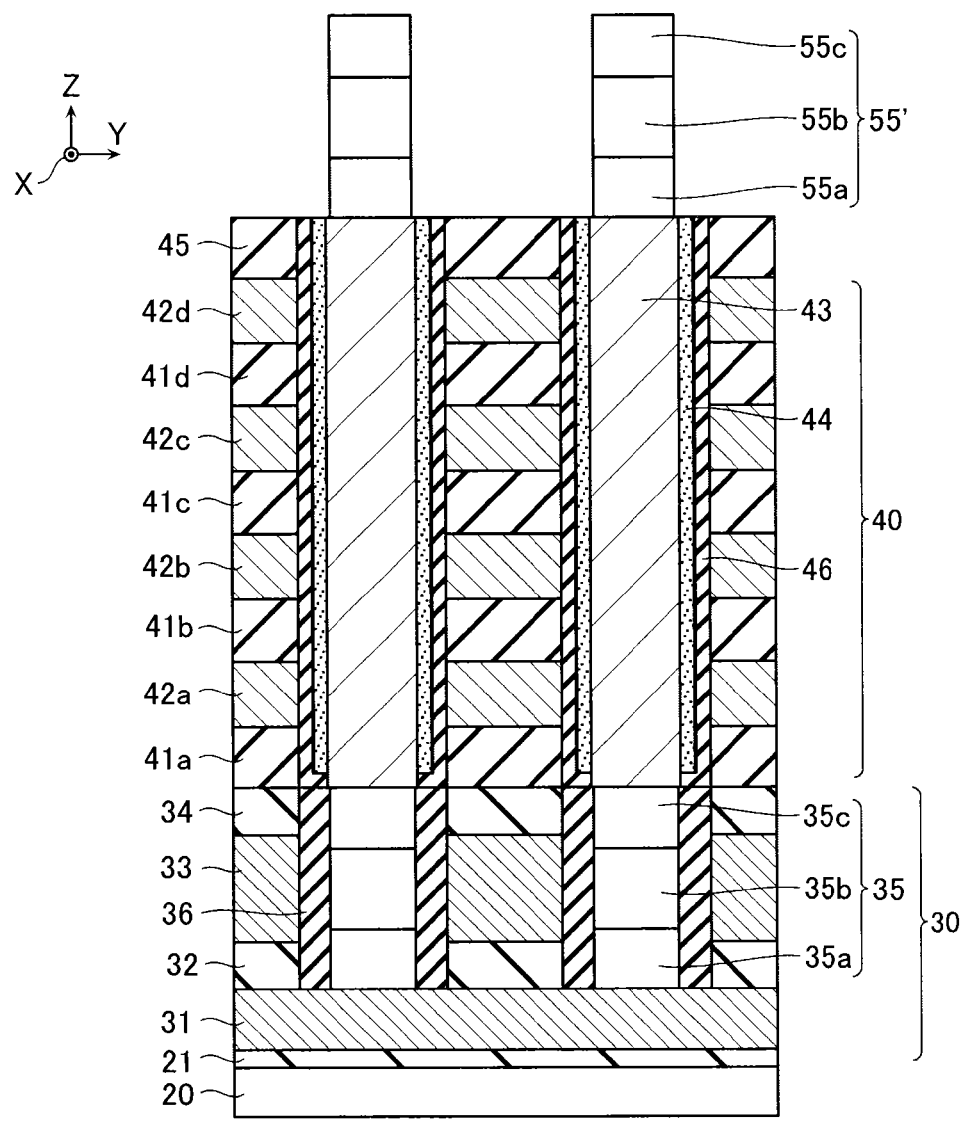
FIG. 22 is an example of a cross-sectional view showing the same manufacturing method.

Next, as shown in FIG. 21, a semiconductor layer 55' (55a, 55b, and 55c) is stacked on an upper surface of the memory layer 40. Next, as shown in FIG. 22, trenches that penetrate the semiconductor layer 55' and that are arranged with a certain pitch in the Y direction and extend in the X direction, are formed.

Figure 23:
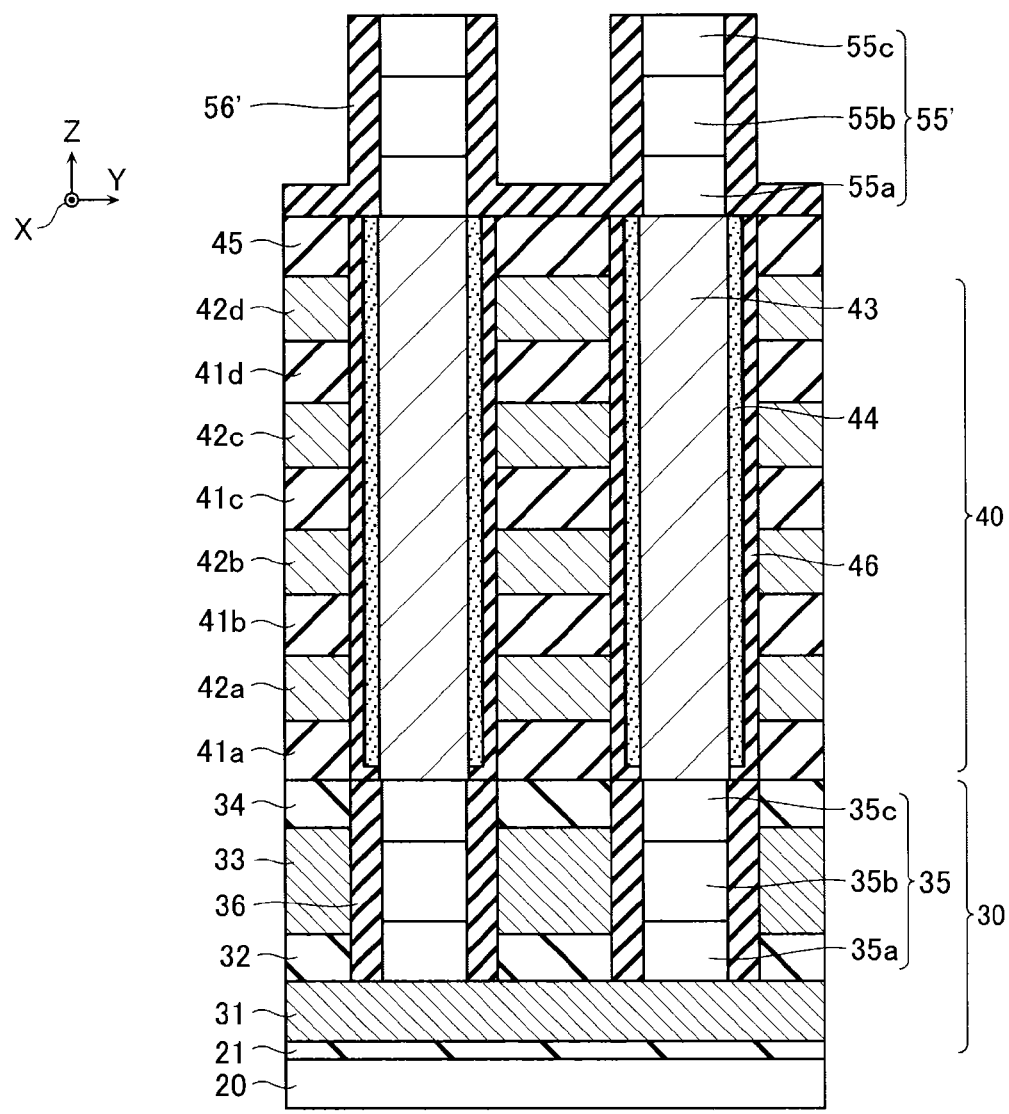
FIG. 23 is an example of a cross-sectional view showing the same manufacturing method.
Figure 24:
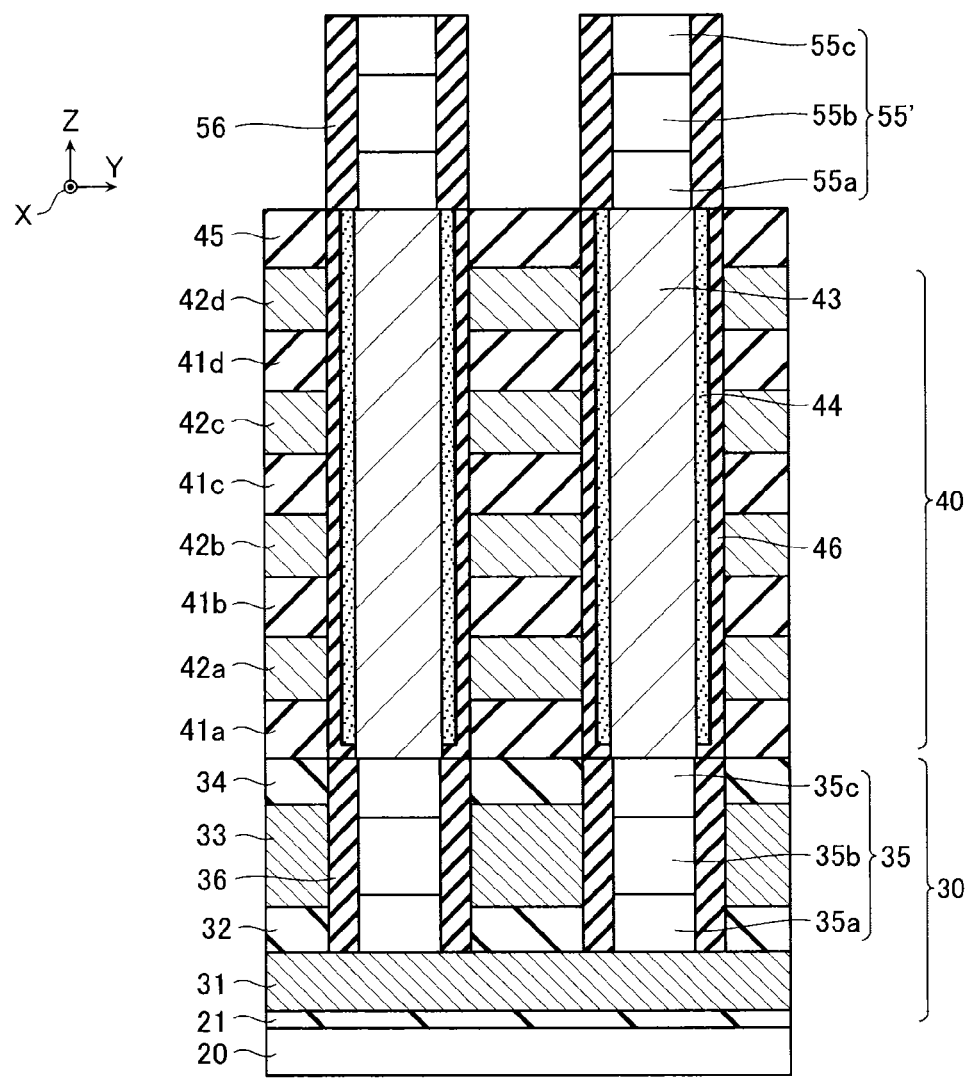
FIG. 24 is an example of a cross-sectional view showing the same manufacturing method.

Next, as shown in FIG. 23, an insulating layer 56' that forms the gate insulating layer 56 is formed on side surfaces and a bottom surface of the trench. Next, as shown in FIG. 24, the insulating layer 56' formed on the bottom surface of the trench is removed to form the gate insulating layer 56.

Figure 25:
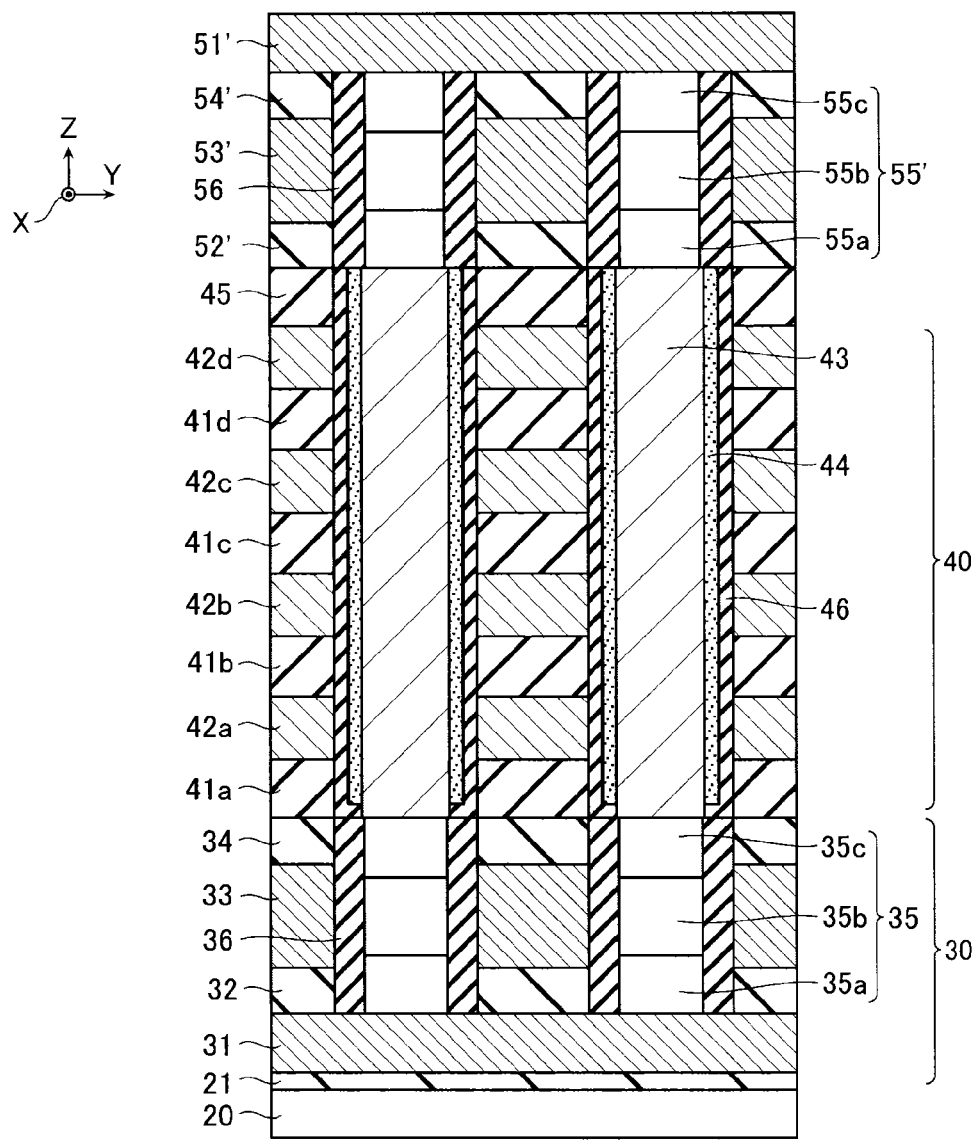
FIG. 25 is an example of a cross-sectional view showing the same manufacturing method.

Next, as shown in FIG. 25, an inter-layer insulating film 52', a conductive layer 53', and an inter-layer insulating film 54' are stacked sequentially on the upper surface of the memory layer 40 so as to fill the trench. Next, a conductive layer 51' that extends in a plate-like shape in the X direction and the Y direction is formed on upper surfaces of the inter-layer insulating film 54', the gate insulating layer 56, and the semiconductor layer 55'.

Figure 26:
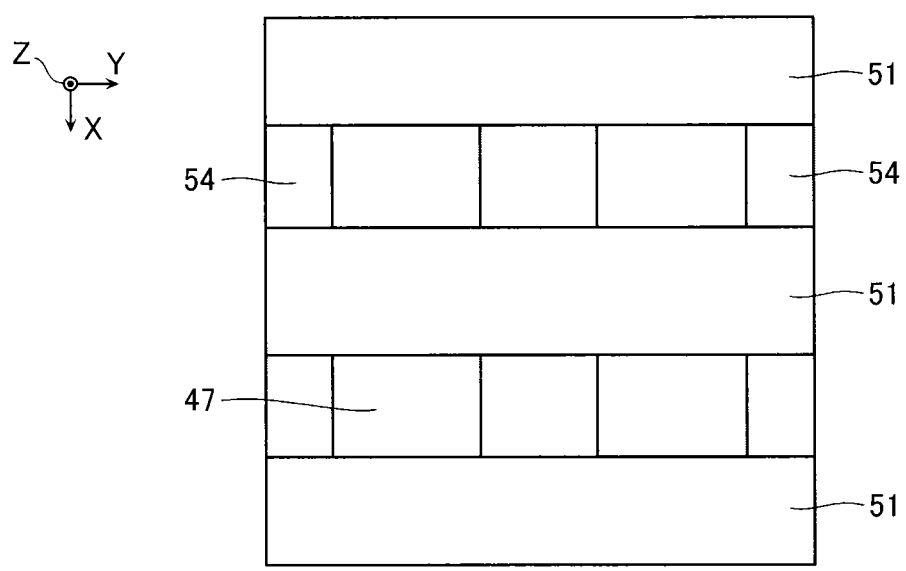
FIG. 26 is an example of a plan view showing the same manufacturing method.

Next, as shown in FIG. 26, trenches that penetrate the conductive layer 51' and the semiconductor layer 55' and that are arranged with a certain pitch in the X direction and extend in the Y direction, are formed. This trench results in the conductive layer 51' becoming the conductive layers 51 extending in a striped shape in the Y direction. In addition, this trench results in the semiconductor layer 55' becoming the semiconductor layers 55 aligned in a matrix in the X direction and the Y direction.

Next, the exposed upper surface of the memory layer 40 (insulating layer 47), exposed sidewalls of the conductive layer 51', and exposed sidewalls of the semiconductor layer 55' are filled in by an inter-layer insulating film not illustrated. Next, heat treatment is performed, and polysilicon of the semiconductor layer 55 is crystallized. The above processes result in the memory cell array 11 according to the present embodiment being manufactured.

Second Embodiment

Configuration

Figure 27:
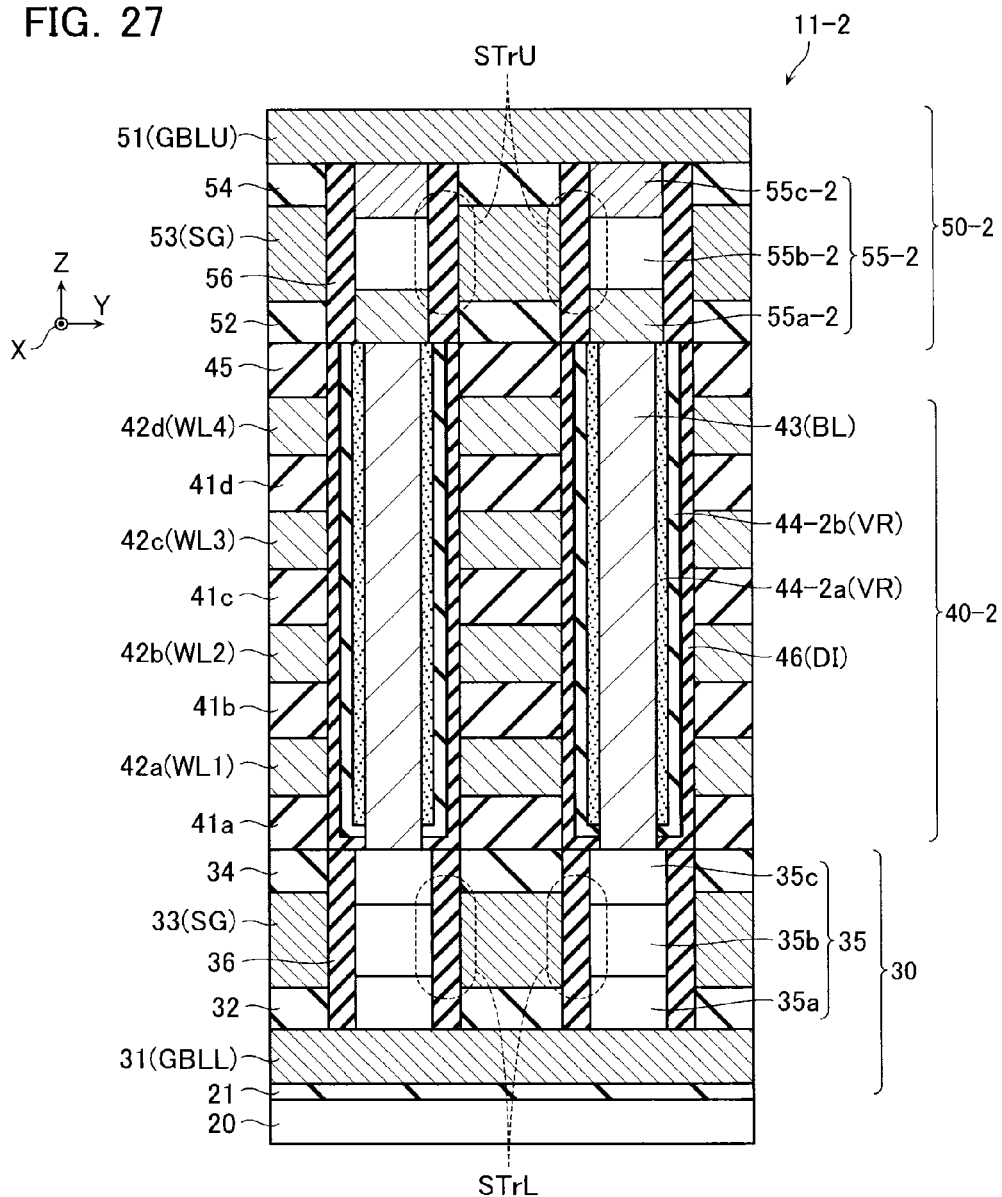
FIG. 27 is an example of a cross-sectional view of a memory cell array 11-2 of a semiconductor memory device according to a second embodiment.

Next, a semiconductor memory device according to a second embodiment will be described. FIG. 27 is an example of a cross-sectional view of a memory cell array 11-2 of the semiconductor memory device according to the second embodiment. The semiconductor memory device according to the present embodiment is configured substantially similarly to the semiconductor memory device according to the first embodiment, but differs from that of the first embodiment in adopting as the variable resistance element VR an ion memory configured from a stacked film of a silicon oxide film and an ion source metal. In addition, a configuration of an upper select transistor layer 50-2 also differs from that of the first embodiment.

A memory layer 40-2 according to the present embodiment is configured substantially similarly to the memory layer 40 according to the first embodiment, but includes an ion source layer 44-2a configured from a metal such as silver (Ag) and a storage layer 44-2b, instead of the variable resistance layer 44 configured from a metal oxide (FIG. 4). The ion source layer 44-2a is provided on a side surface in the Y direction of the conductive layer 43. Moreover, the storage layer 44-2b is provided between the ion source layer 44-2a and the rectifier layer 46.

In the upper select transistor layer 50-2 according to the present embodiment, a semiconductor layer 55-2 includes a drain electrode layer 55a-2, a channel layer 55b-2, and a source electrode layer 55c-2 stacked from below to above. The drain electrode layer 55a-2 and the source electrode layer 55c-2 are configured by a metallic material such as Al, Ni, Cu, Mo, W, Ta, Ti, and so on, or a nitride thereof, or an alloy thereof. These metallic material, nitride thereof, and alloy thereof are referred to below as "metallic material, and so on". The channel layer 55b-2 is configured by an oxide semiconductor such as InO, ZnO, GaO, InGaZnO, CuO, TiO, and so on.

[Manufacturing Method]

Next, a manufacturing method of the semiconductor memory device according to the second embodiment will be described. The semiconductor memory device according to the second embodiment is manufactured by substantially similar processes to the semiconductor memory device according to the first embodiment, but the processes below are different.

First, in a process corresponding to the process described using FIG. 16 in the first embodiment, the insulating layer 46' that forms the rectifier layer 46, the ion source layer 44-2a, and the storage layer 44-2b are formed on the side surfaces and bottom surface of the trench. Next, in a process corresponding to the process described using FIG. 17, the insulating layer 46', the ion source layer 44-2a, and the storage layer 44-2b formed on the bottom surface of the trench are removed, and the rectifier layer 46, the ion source layer 44-2a, and the storage layer 44-2b are formed on the entire side surface of the trench.

In addition, in a process corresponding to the process described using FIG. 21 in the first embodiment, the metallic material, and so on, that forms the drain electrode layer 55a-2, the oxide semiconductor that forms the channel layer 55b-2, and the metallic material, and so on, that forms the source electrode layer 55c-2, are sequentially stacked. Moreover, heat treatment for crystallizing polysilicon is not performed after this process has been performed.

In the first embodiment, polysilicon was employed as a material of the semiconductor layer 55, hence heat treatment for crystallization was performed. However, when an ion memory is adopted as memory, there is a possibility that this heat treatment causes characteristics of the ion source layer 44-2a to end up changing, and characteristics as a memory to end up being impaired.

In contrast, in the manufacturing method of the semiconductor memory device according to the present embodiment, the semiconductor layer 55-2 is formed from the metallic material, and so on, and the oxide semiconductor. Therefore, heat treatment for crystallizing polysilicon is unnecessary, and it is possible to manufacture a semiconductor memory device having favorable characteristics.

Third Embodiment

Configuration

Figure 28:
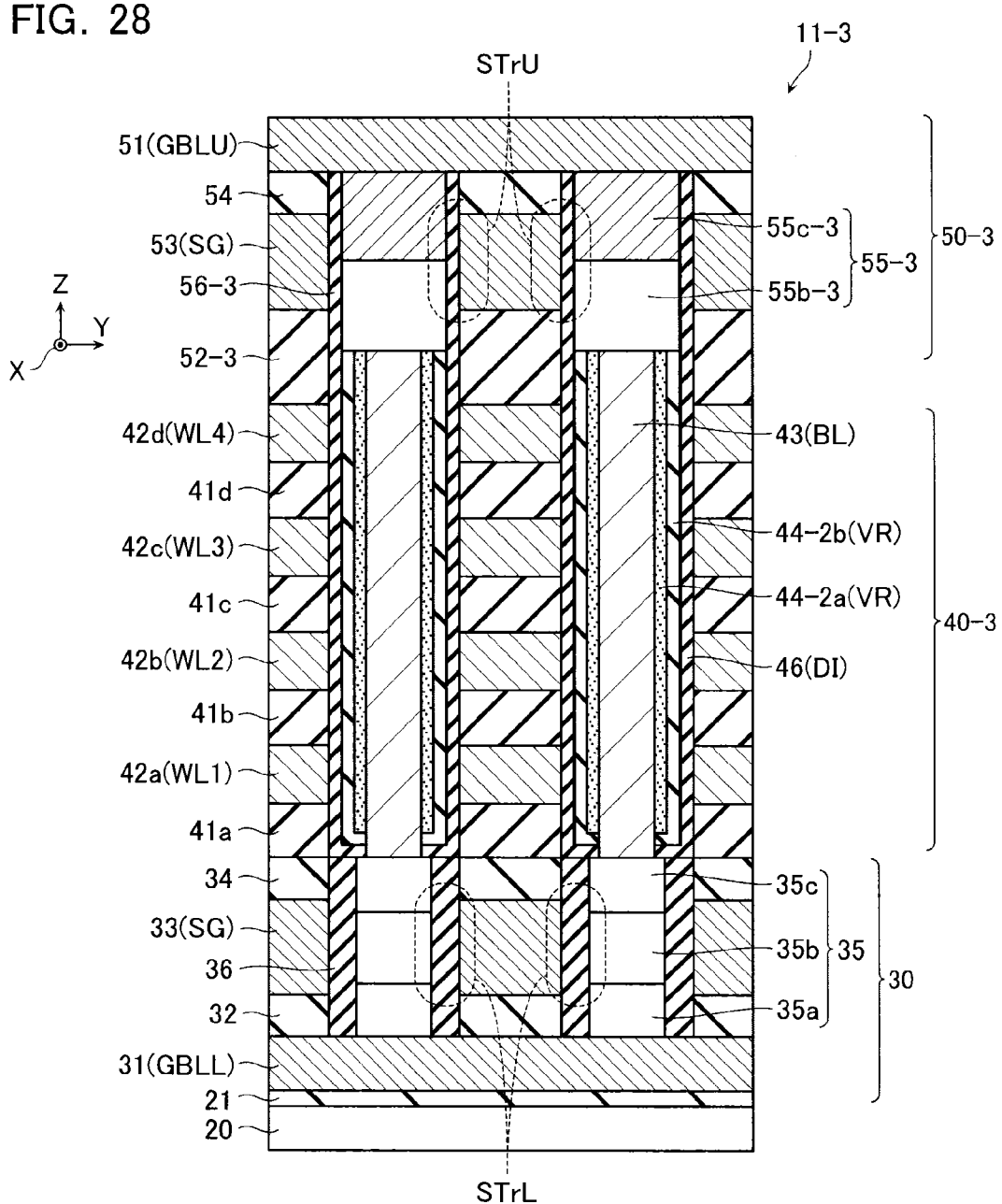
FIG. 28 is an example of a cross-sectional view of a memory cell array 11-3 of a semiconductor memory device according to a third embodiment.

Next, a semiconductor memory device according to a third embodiment will be described. FIG. 28 is an example of a cross-sectional view of a memory cell array 11-3 of the semiconductor memory device according to the third embodiment. The semiconductor memory device according to the present embodiment is configured substantially similarly to the semiconductor memory device according to the second embodiment, but configurations of a memory layer 40-3 and an upper select transistor layer 50-3 are partially different.

That is, as shown in FIG. 28, a gate insulating layer (second insulating layer) 56-3 is interposed between a semiconductor layer 55-3 and the conductive layer 53, and the rectifier layer (first insulating layer) 46 is interposed between the conductive layer 43 (bit line BL) and the conductive layers 42a to 42d (WL1 to WL4). Now, in the present embodiment, these gate insulating layer 56-3 and rectifier layer 46 are formed in an integrated manner and have substantially similar film thicknesses.

In addition, the semiconductor layer 55-3 according to the present embodiment is configured from a channel layer 55b-3 formed on an upper surface of the conductive layer 43, and a source electrode layer 55c-3 stacked on this channel layer 55b-3.

Note that in other respects, the upper select transistor layer 50-3 according to the present embodiment is configured substantially similarly to the upper select transistor layer 50-2 according to the second embodiment. Moreover, the memory layer 40-3 is configured substantially similarly to the memory layer 40-2 according to the second embodiment, but differs in not including the protective layer 45.

[Manufacturing Method]

Next, a manufacturing method of the semiconductor memory device according to the third embodiment will be described with reference to FIGS. 29 to 36. FIGS. 29 to 35 are examples of cross-sectional views showing the manufacturing method of a memory cell array 11-3 according to the present embodiment. FIG. 36 is an example of a plan view showing the same manufacturing method. The semiconductor memory device according to the present embodiment is manufactured similarly to the semiconductor memory device according to the first embodiment as far as steps shown in FIG. 13.

Figure 29:
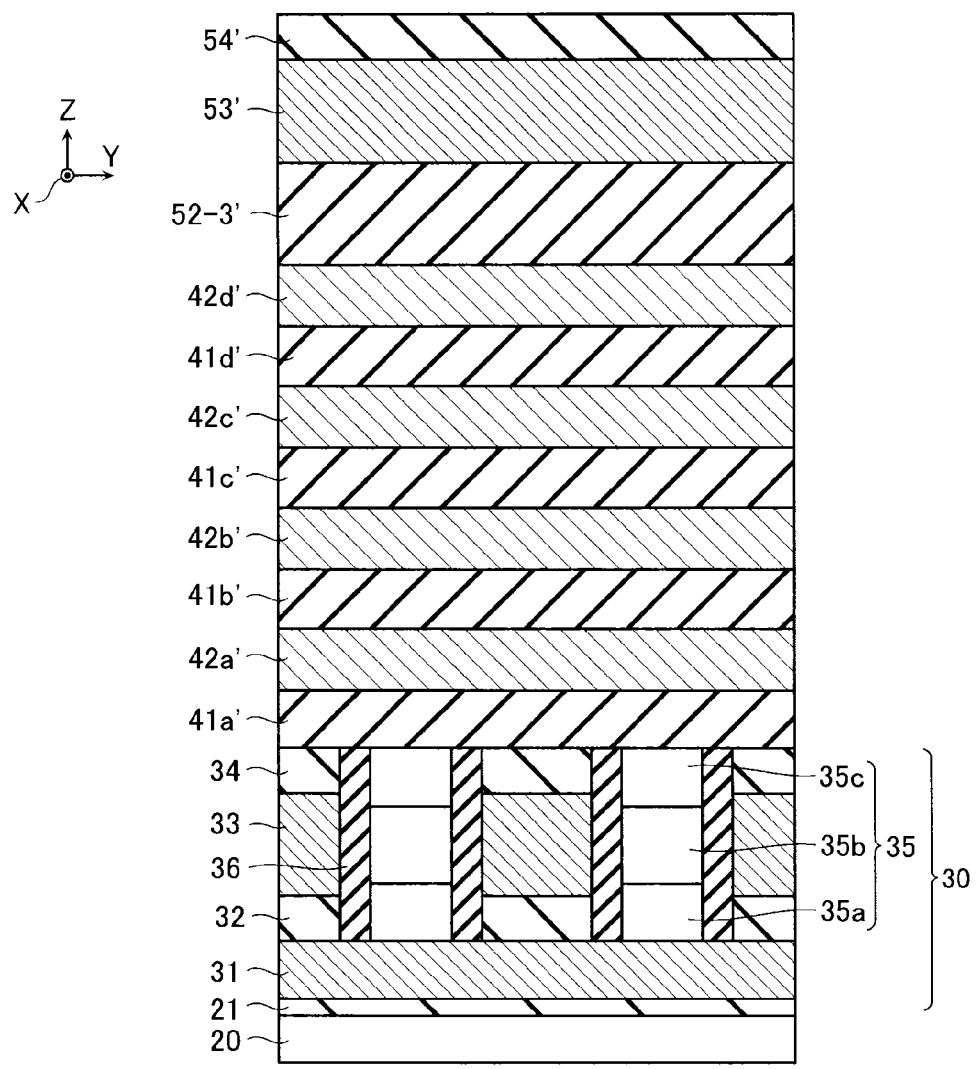
FIG. 29 is an example of a cross-sectional view showing a manufacturing method of the same semiconductor memory device.

As shown in FIG. 29, silicon oxide ($SiO_2$) and polysilicon (Si) are stacked alternately on the upper surface of the lower select transistor layer 30 to sequentially stack thereon the inter-layer insulating layers 41a' to 41d', the conductive layers 42a' to 42d', an inter-layer insulating film 52-3', a conductive layer 53', and an inter-layer insulating film 54' that extend in a plate-like shape in the X direction and the Y direction.

Figure 30:
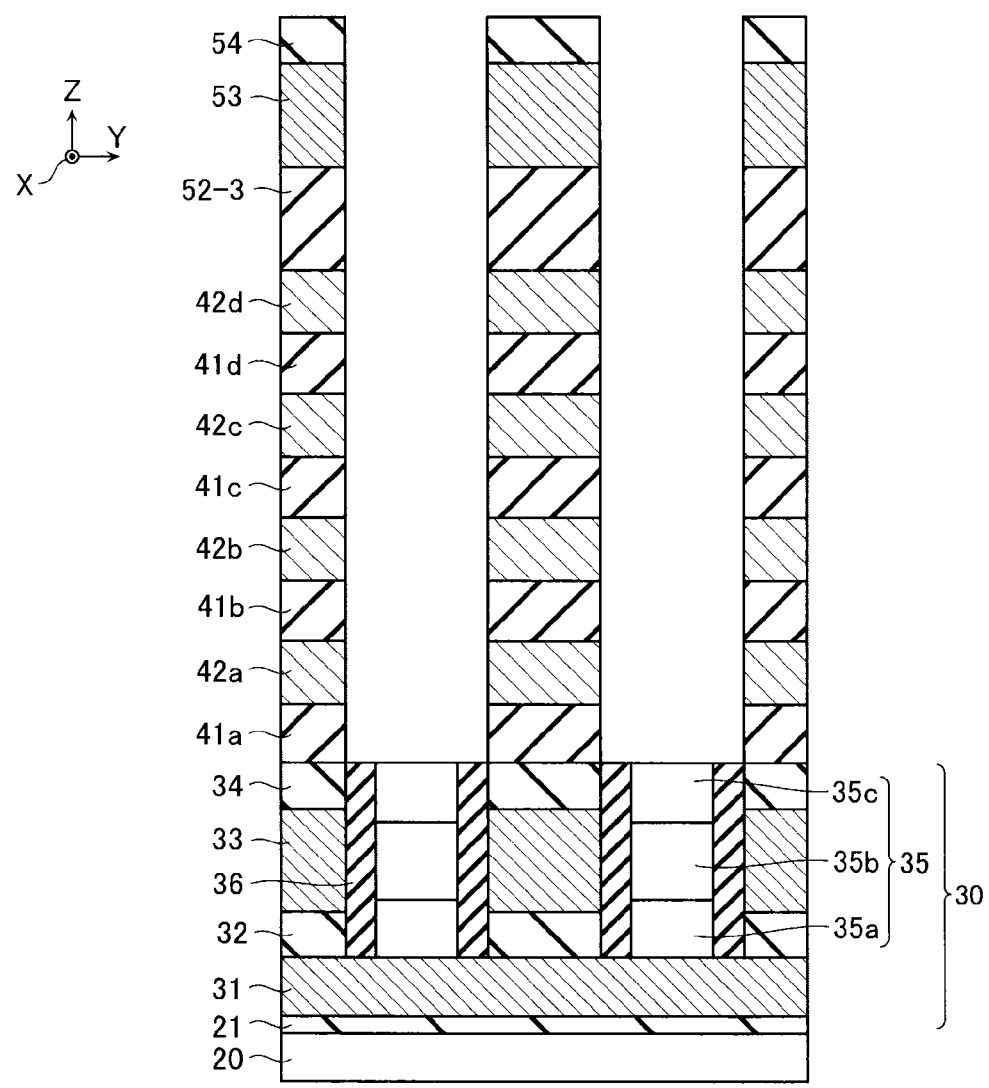
FIG. 30 is an example of a cross-sectional view showing the same manufacturing method.

Next, as shown in FIG. 30, trenches that penetrate the inter-layer insulating layers 41a' to 41d', the conductive layers 42a' to 42d', the inter-layer insulating film 52-3', the conductive layer 53', and the inter-layer insulating film 54', are formed. The trenches are arranged with a certain pitch in the Y direction and are formed extending in the X direction. This trench results in the inter-layer insulating layers 41a' to 41d', the conductive layers 42a' to 42d', the inter-layer insulating film 52-3', the conductive layer 53', and the inter-layer insulating film 54' becoming the inter-layer insulating layers 41a to 41d, the conductive layers 42a to 42d, the inter-layer insulating films 52-3, the conductive layers 53, and the inter-layer insulating films 54 that extend in a striped shape in the X direction.

Figure 31:
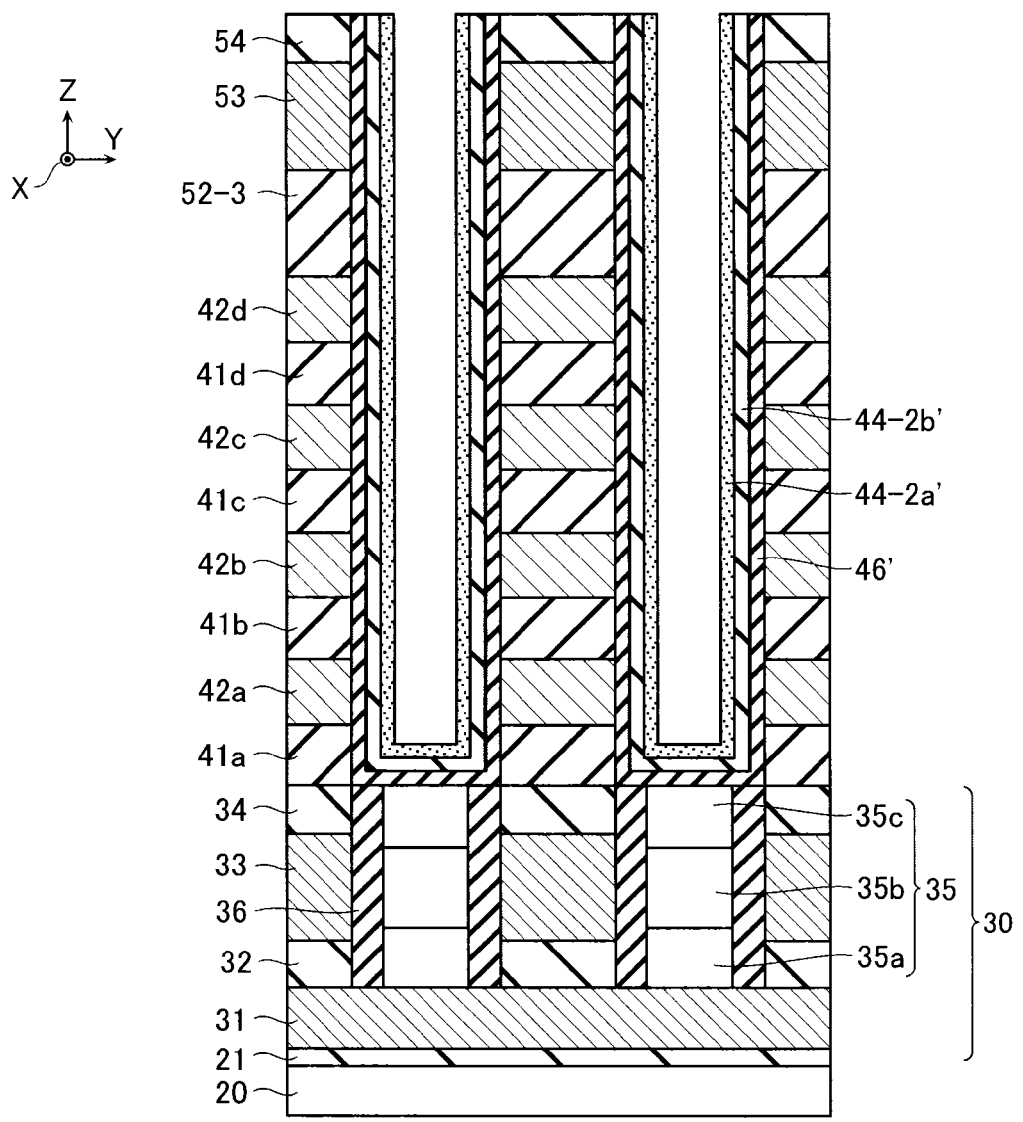
FIG. 31 is an example of a cross-sectional view showing the same manufacturing method.

Next, as shown in FIG. 31, the insulating layer 46' that is to become the rectifier layer 46 and gate insulating layer 56-3, a storage layer 44-2b', and an ion source layer 44-2a' are formed sequentially on side surfaces and a bottom surface of the trench.

Figure 32:
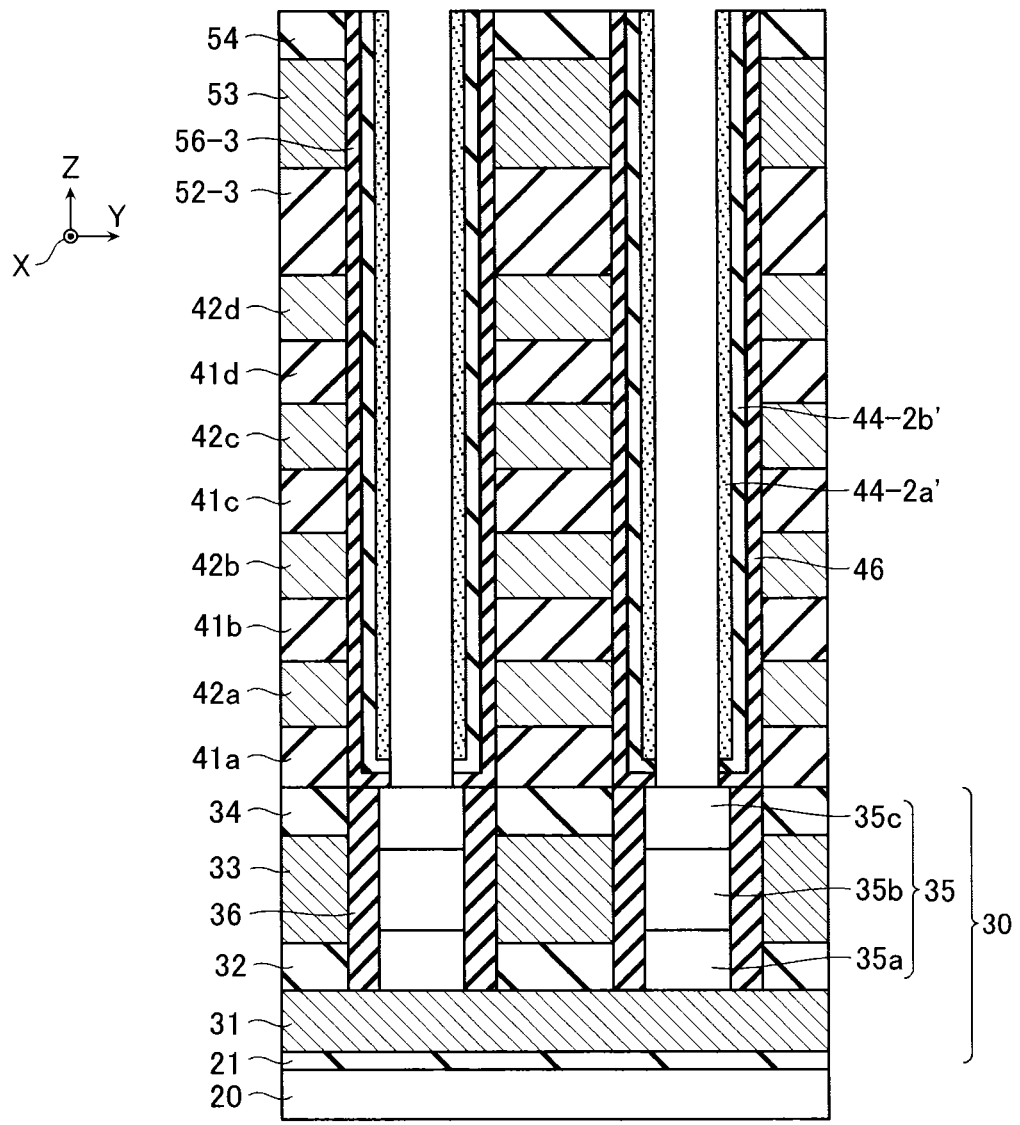
FIG. 32 is an example of a cross-sectional view showing the same manufacturing method.

Next, as shown in FIG. 32, the insulating layer 46', the storage layer 44-2b', and the ion source layer 44-2a' formed on the bottom surface of the trench are removed, and the rectifier layer 46, the gate insulating layer 56-3, the storage layer 44-2b', and the ion source layer 44-2a' are formed on the entire side surface of the trench.

Figure 33:
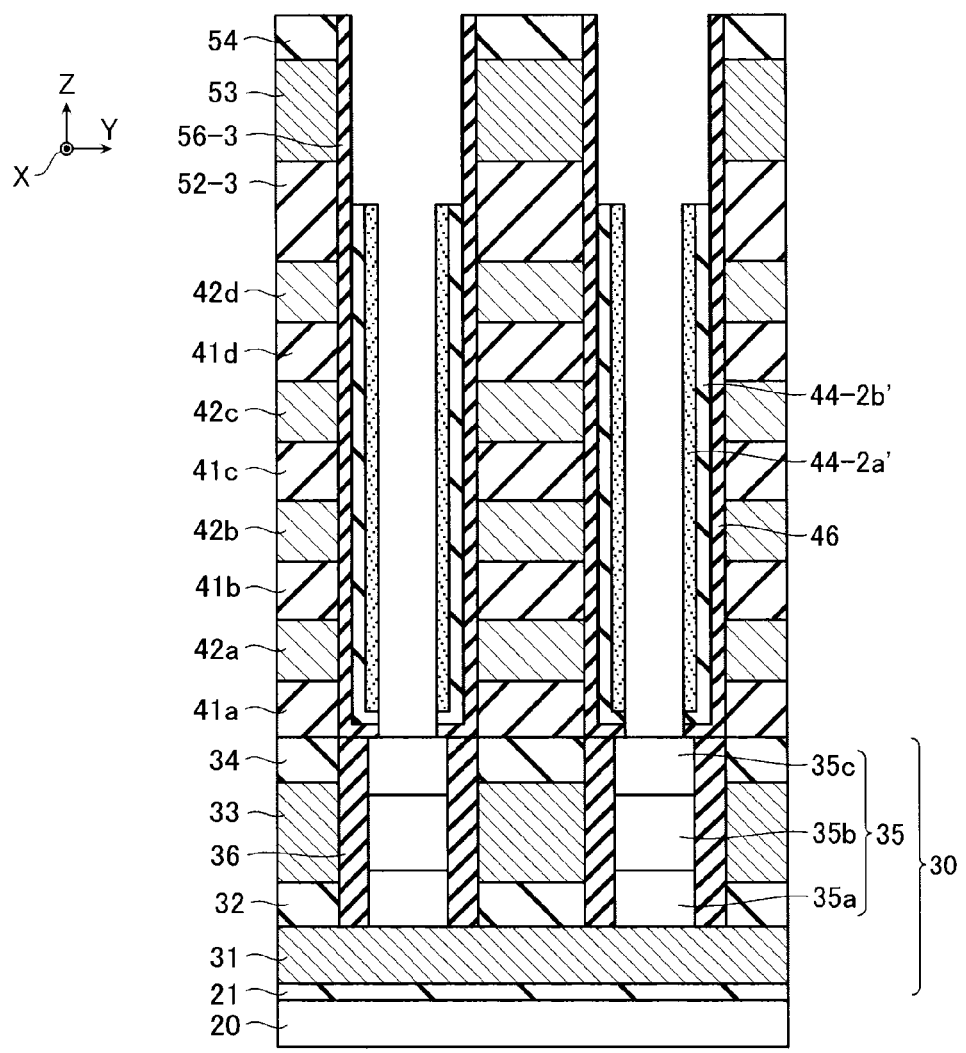
FIG. 33 is an example of a cross-sectional view showing the same manufacturing method.

Next, as shown in FIG. 33, a portion of the storage layer 44-2b' and the ion source layer 44-2a' facing the conductive layer 53 via the gate insulating layer 56-3 is removed. This process is performed by, for example, implanting a sacrifice film or the like, not illustrated, from the bottom surface of the trench to a portion contacting the inter-layer insulating film 52-3 via the gate insulating layer 56-3, and then performing etching, or the like.

Figure 34:
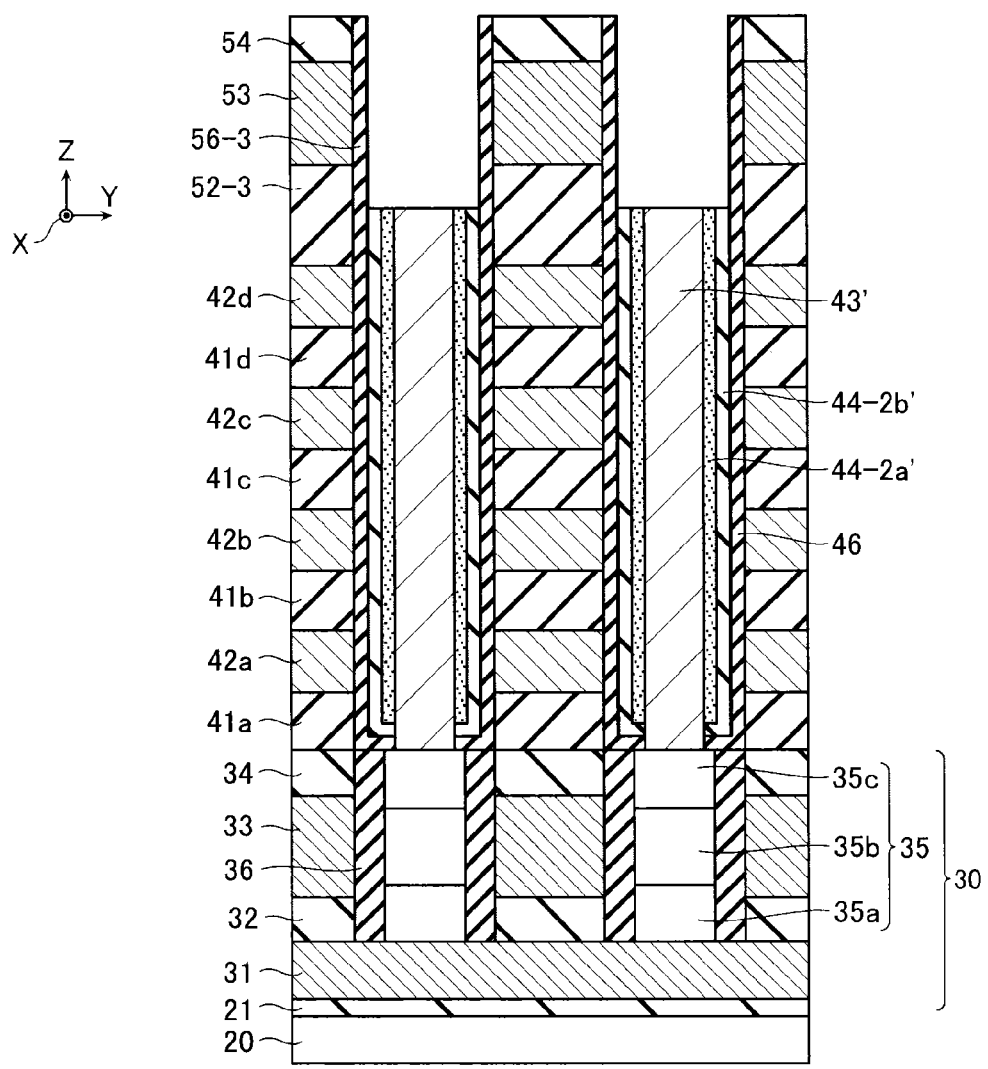
FIG. 34 is an example of a cross-sectional view showing the same manufacturing method.

Next, as shown in FIG. 34, the conductive layer 43' is formed from the bottom surface of the trench to an upper end portion of the ion source layer 44-2a'.

Figure 35:
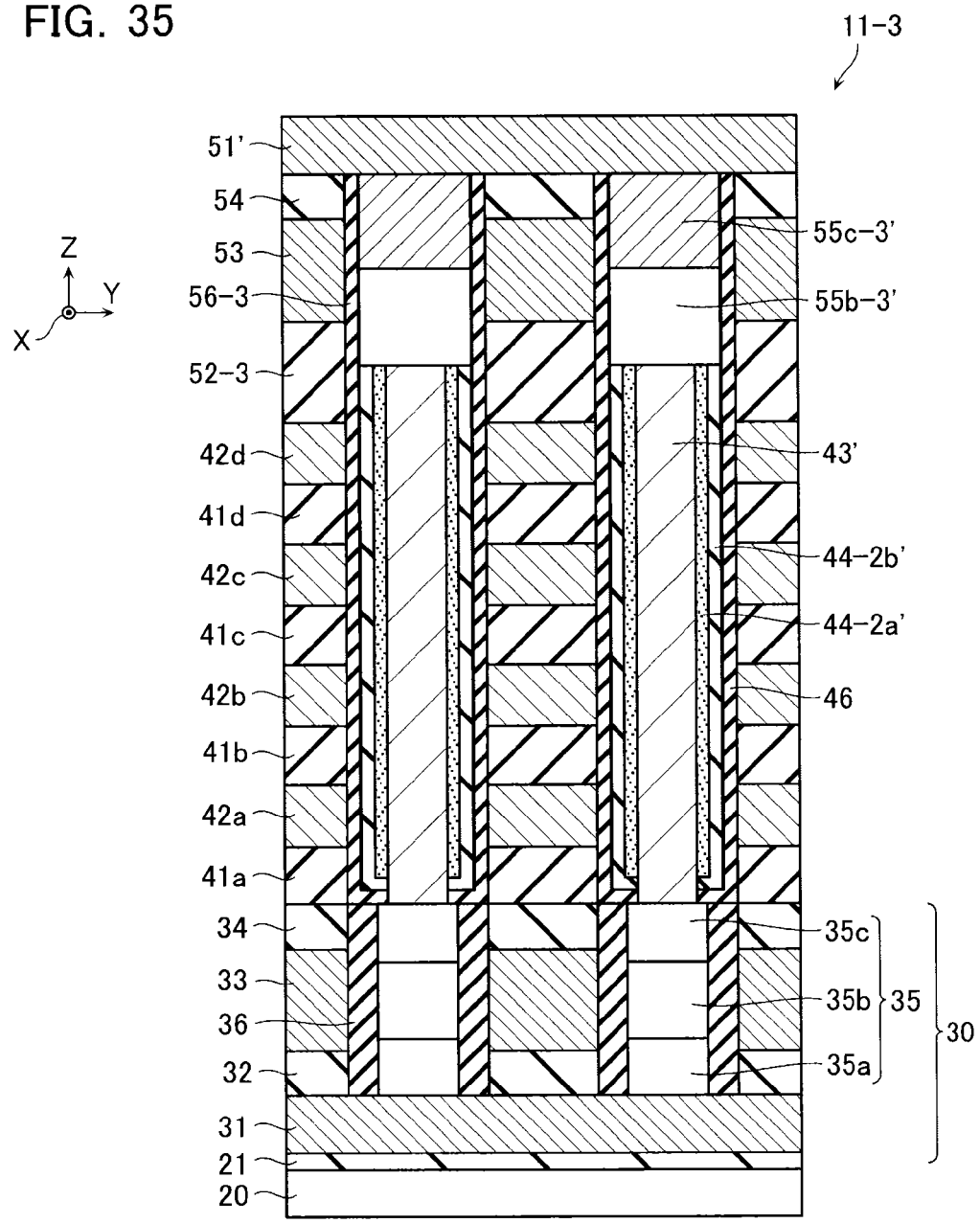
FIG. 35 is an example of a cross-sectional view showing the same manufacturing method.
Figure 36:
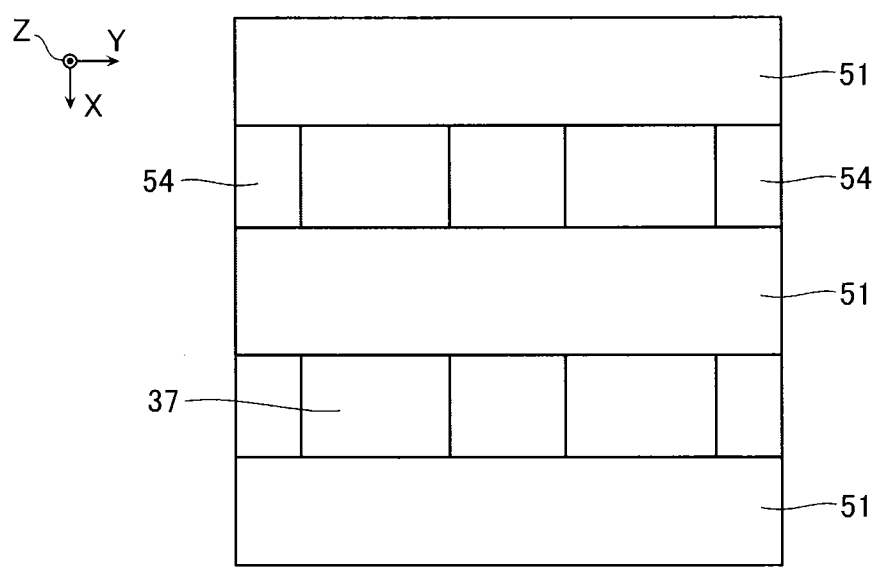
FIG. 36 is an example of a plan view showing the same manufacturing method.

Next, as shown in FIG. 35, a channel layer 55b-3' and a source electrode layer 55c-3' are stacked sequentially on upper surfaces of the conductive layer 43', the ion source layer 44-2a', and the storage layer 44-2b', so as to fill a remaining portion of the trench. Next, the conductive layer 51' that extends in a plate-like shape in the X direction and the Y direction is formed on upper surfaces of the inter-layer insulating film 54, the gate insulating layer 56-3, and the source electrode layer 55c-3'.

Following this, as shown in FIG. 36, RIE is performed on the conductive layer 51', the source electrode layer 55c-3', the channel layer 55b-3', and the conductive layer 43' by a similar method to in the first embodiment to form trenches that are arranged with a certain pitch in the X direction and extend in the Y direction. This trench results in the conductive layer 51' becoming the conductive layers 51 extending in a striped shape in the Y direction. In addition, this trench results in the source electrode layer 55c-3' and channel layer 55b-3' and the conductive layer 43' becoming, respectively, the semiconductor layers 55-3 and the conductive layers 43 aligned in a matrix in the X direction and the Y direction.

Next, silicon oxide ($SiO_2$) is deposited in the trench by a similar method to in the first embodiment, and an inter-layer insulating layer not illustrated is formed in the trench. The above processes result in the memory cell array 11-3 according to the present embodiment being manufactured.

In the present embodiment, RIE processing of the memory layer 40-3 and the upper select transistor layer 50-3 is performed in a batch. Therefore, the number of manufacturing steps can be reduced compared to in the manufacturing method of the semiconductor memory device according to the second embodiment.

Fourth Embodiment

Configuration

Figure 37:
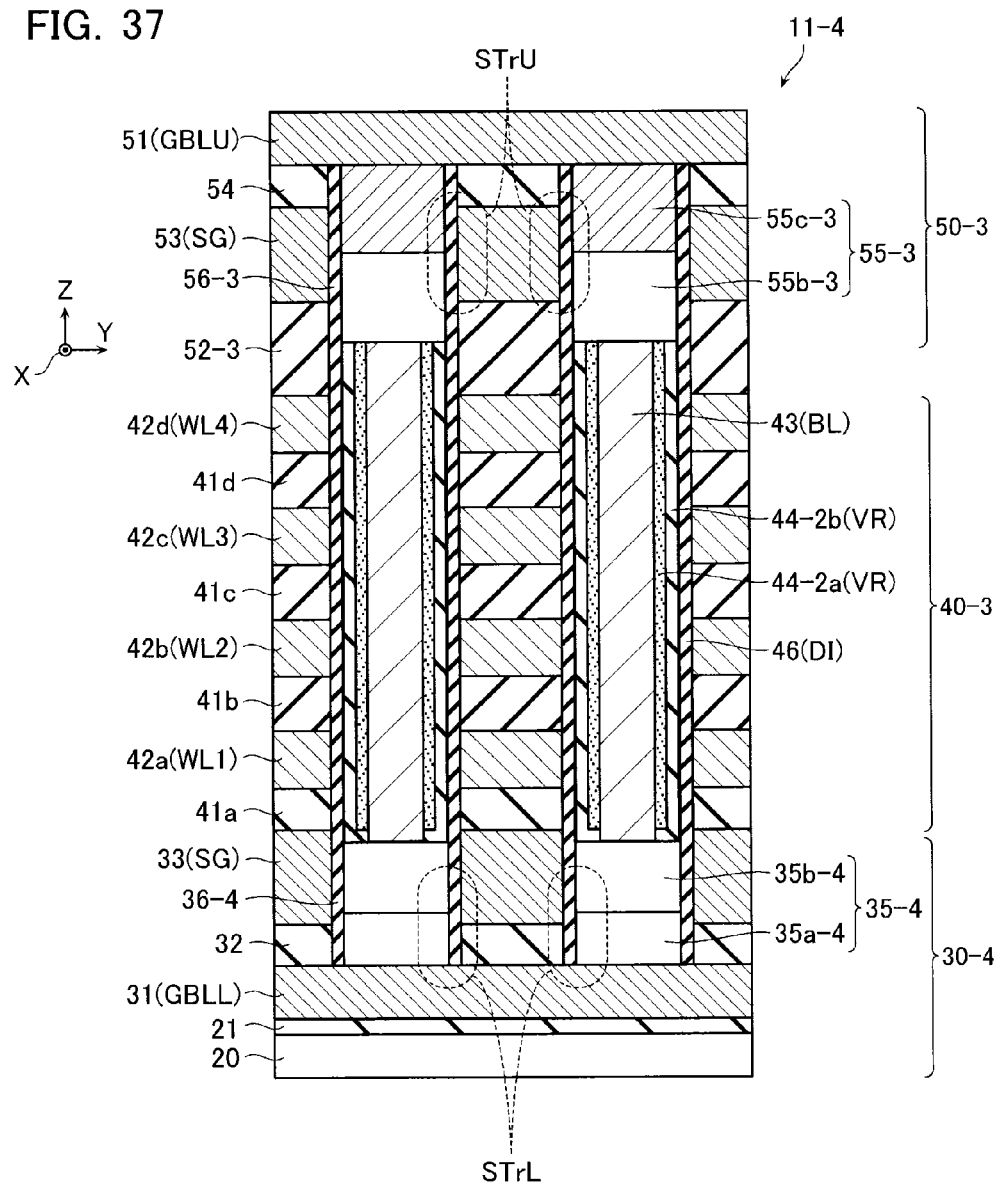
FIG. 37 is an example of a cross-sectional view of a memory cell array 11-4 of a semiconductor memory device according to a fourth embodiment.

Next, a semiconductor memory device according to a fourth embodiment will be described. FIG. 37 is an example of a cross-sectional view of a memory cell array 11-4 of the semiconductor memory device according to the fourth embodiment. The semiconductor memory device according to the present embodiment is configured substantially similarly to the semiconductor memory device according to the third embodiment, but a configuration of a lower select transistor layer 30-4 is partially different.

That is, as shown in FIG. 37, the gate insulating layer (second insulating layer) 56-3 is interposed between the semiconductor layer 55-3 and the conductive layer 53, the rectifier layer (first insulating layer) 46 is interposed between the conductive layer 43 (bit line BL) and the conductive layers 42a to 42d (WL1 to WL4), and a gate insulating layer (third insulating layer) 36-4 is interposed between a semiconductor layer 35-4 and the conductive layer 33. Now, in the present embodiment, these gate insulating layer 56-3, rectifier layer 46, and gate insulating film 36-4 are formed in an integrated manner and have substantially similar film thicknesses.

In addition, the semiconductor layer 35-4 according to the present embodiment is configured from an N+ type semiconductor layer 35a-4 formed on an upper surface of the conductive layer 31, and a P+ type semiconductor layer 35b-4 stacked on this N+ type semiconductor layer 35a-4. Therefore, in the present embodiment, the inter-layer insulating layer 41a is formed directly on an upper surface of the conductive layer 33. Similarly, the conductive layer 43, the ion source layer 44-2a, and the storage layer 44-2b are formed directly on the P+ type semiconductor layer 35b-4.

Note that in other respects, the lower select transistor layer 30-4 according to the present embodiment is configured substantially similarly to the lower select transistor layer 30 according to the third embodiment.

[Manufacturing Method]

Next, a manufacturing method of the semiconductor memory device according to the present embodiment will be described with reference to FIGS. 38 to 51. FIGS. 38 and 41 to 50 are examples of cross-sectional views showing the manufacturing method of the memory cell array 11-4. Moreover, FIGS. 39, 40, and 51 are examples of plan views showing the same manufacturing method.

Figure 38:
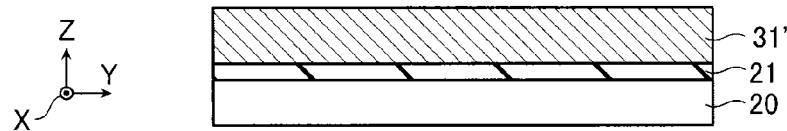
FIG. 38 is an example of a cross-sectional view showing a manufacturing method of the same semiconductor memory device.

In the present embodiment, as shown in FIG. 38, the conductive layer 31' is stacked on the substrate 20 via the inter-layer insulating layer 21.

Figure 39:
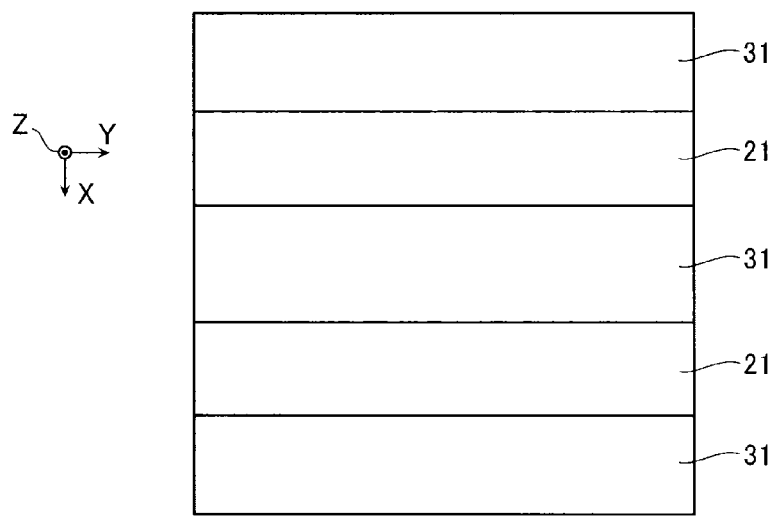
FIG. 39 is an example of a plan view showing the same manufacturing method.

Next, as shown in FIG. 39, trenches that penetrate the conductive layer 31' and that are arranged with a certain pitch in the X direction and extend in the Y direction, are formed. This trenches result in the conductive layer 31' becoming the conductive layers 31 extending in a striped shape in the Y direction.

Figure 40:
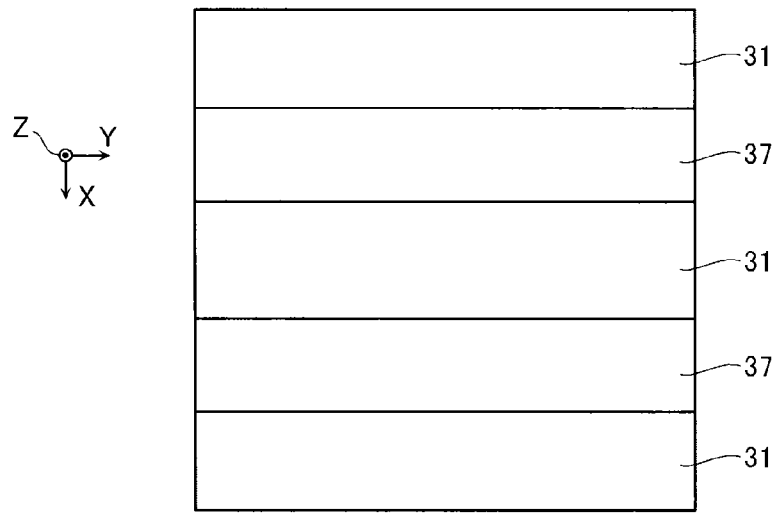
FIG. 40 is an example of a plan view showing the same manufacturing method.

Next, as shown in FIG. 40, an exposed upper surface of the inter-layer insulating layer 21 and exposed sidewalls of the conductive layer 31 are filled in by the inter-layer insulating film 37.

Figure 41:
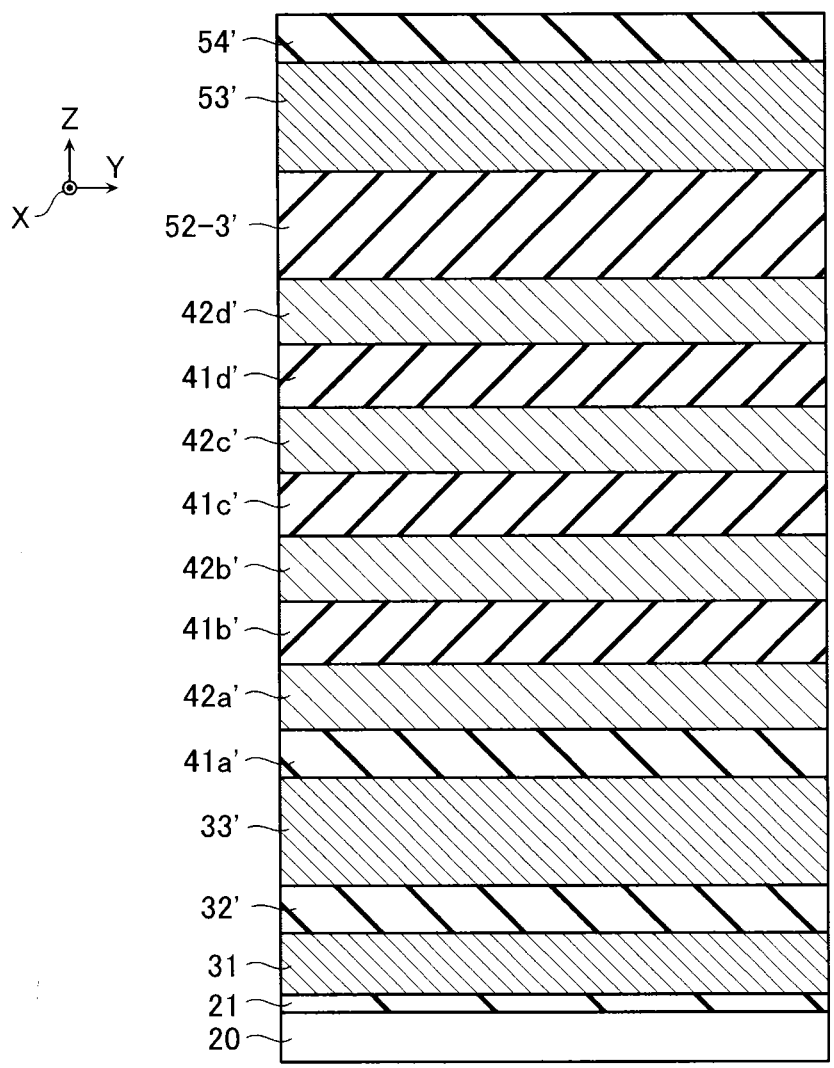
FIG. 41 is an example of a cross-sectional view showing the same manufacturing method.

Next, as shown in FIG. 41, silicon oxide (SiO$_2$) and polysilicon (Si) are stacked alternately on the conductive layer 31 to sequentially stack thereon an insulating layer 32', a conductive layer 33', the inter-layer insulating layers 41a' to 41d', the conductive layers 42a' to 42d', the inter-layer insulating film 52-3', the conductive layer 53', and the inter-layer insulating film 54' that extend in a plate-like shape in the X direction and the Y direction.

Figure 42:
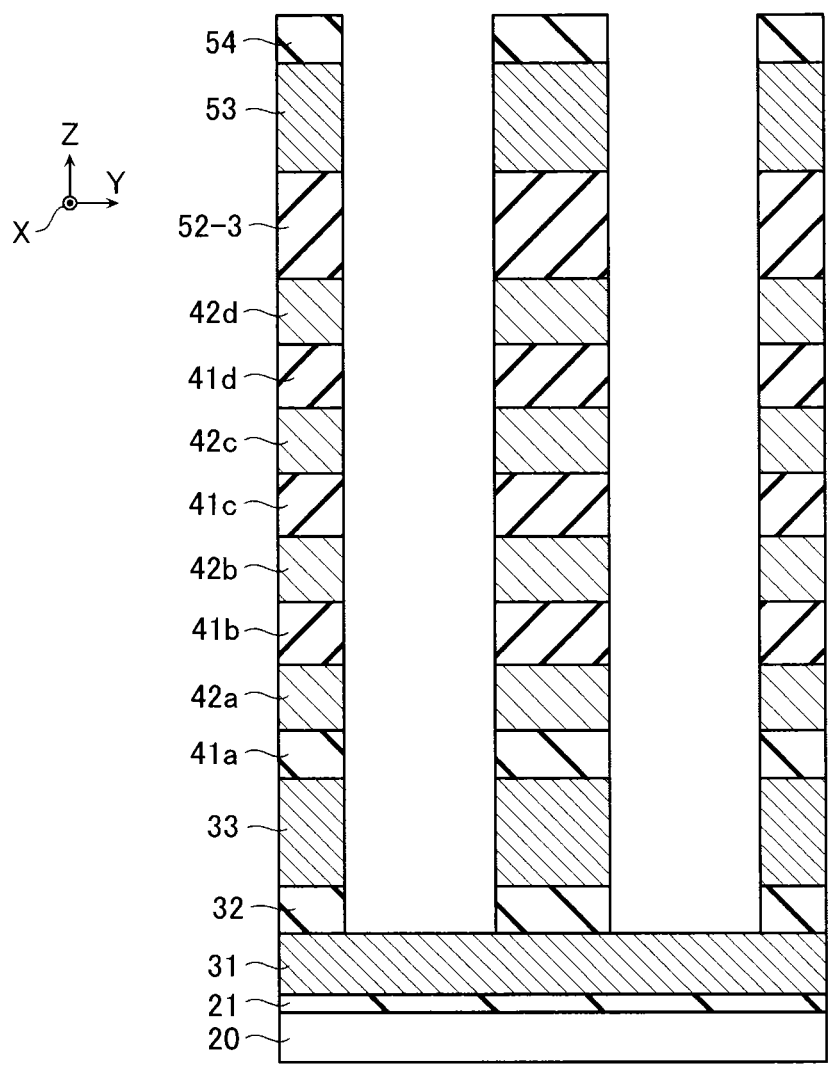
FIG. 42 is an example of a cross-sectional view showing the same manufacturing method.

Next, as shown in FIG. 42, trenches that penetrate the insulating layer 32', the conductive layer 33', the inter-layer insulating layers 41a' to 41d', the conductive layers 42a' to 42d', the inter-layer insulating film 52-3', the conductive layer 53', and the inter-layer insulating film 54', are formed. These trenches are arranged with a certain pitch in the Y direction and are formed extending in the X direction. This trench results in the insulating layer 32', the conductive layer 33', the inter-layer insulating layers 41a' to 41d', the conductive layers 42a' to 42d', the inter-layer insulating film 52-3', the conductive layer 53', and the inter-layer insulating film 54' becoming the insulating layer 32, the conductive layer 33, the inter-layer insulating layers 41a to 41d, the conductive layers 42a to 42d, the inter-layer insulating films 52-3, the conductive layers 53, and the inter-layer insulating films 54 that extend in a striped shape in the X direction.

Figure 43:
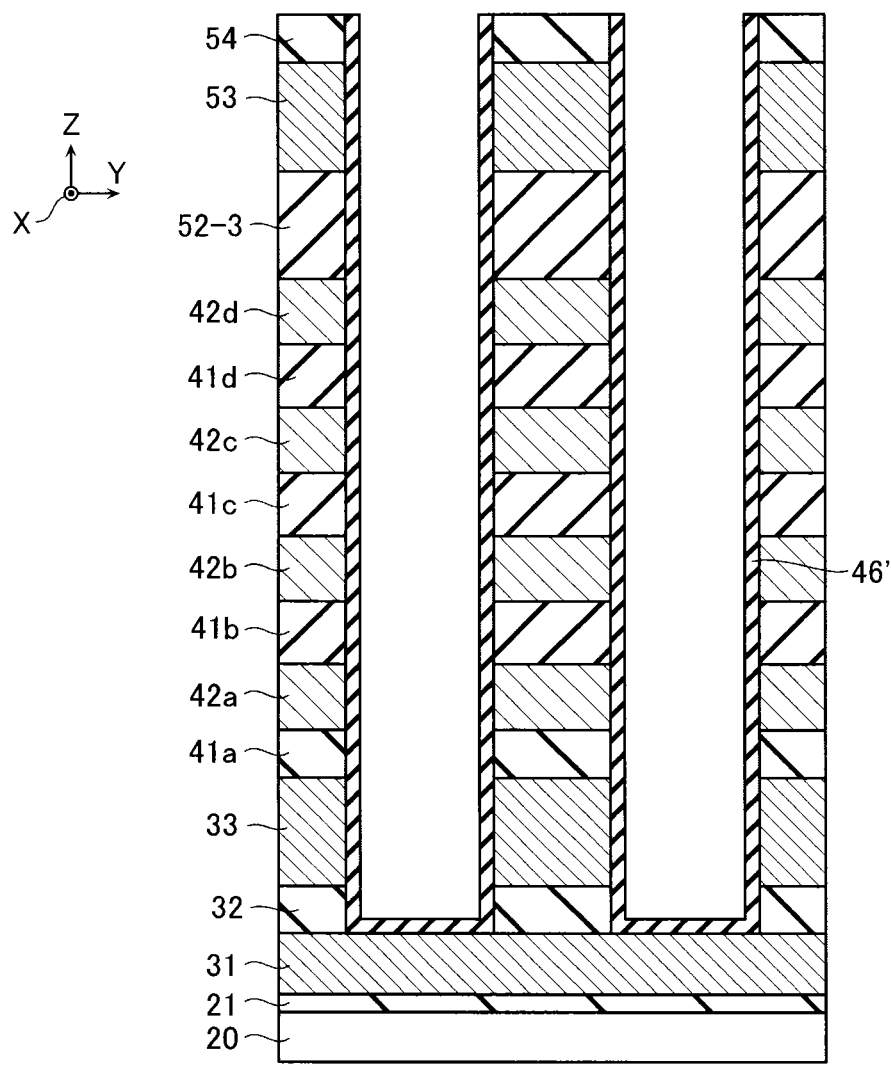
FIG. 43 is an example of a cross-sectional view showing the same manufacturing method.

Next, as shown in FIG. 43, the insulating layer 46' that is to become the gate insulating layer 36-4, the rectifier layer 46, and the gate insulating layer 56-3 is formed on side surfaces and a bottom surface of the trench.

Figure 44:
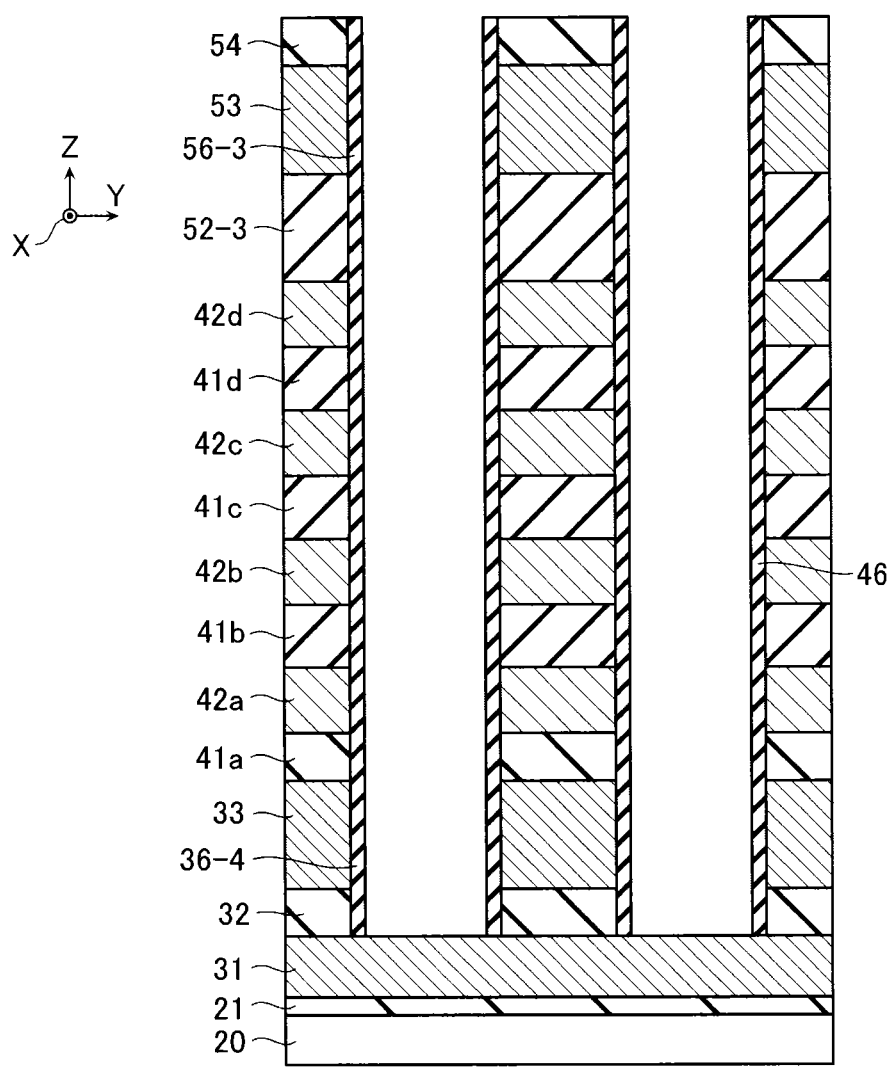
FIG. 44 is an example of a cross-sectional view showing the same manufacturing method.
Figure 45:
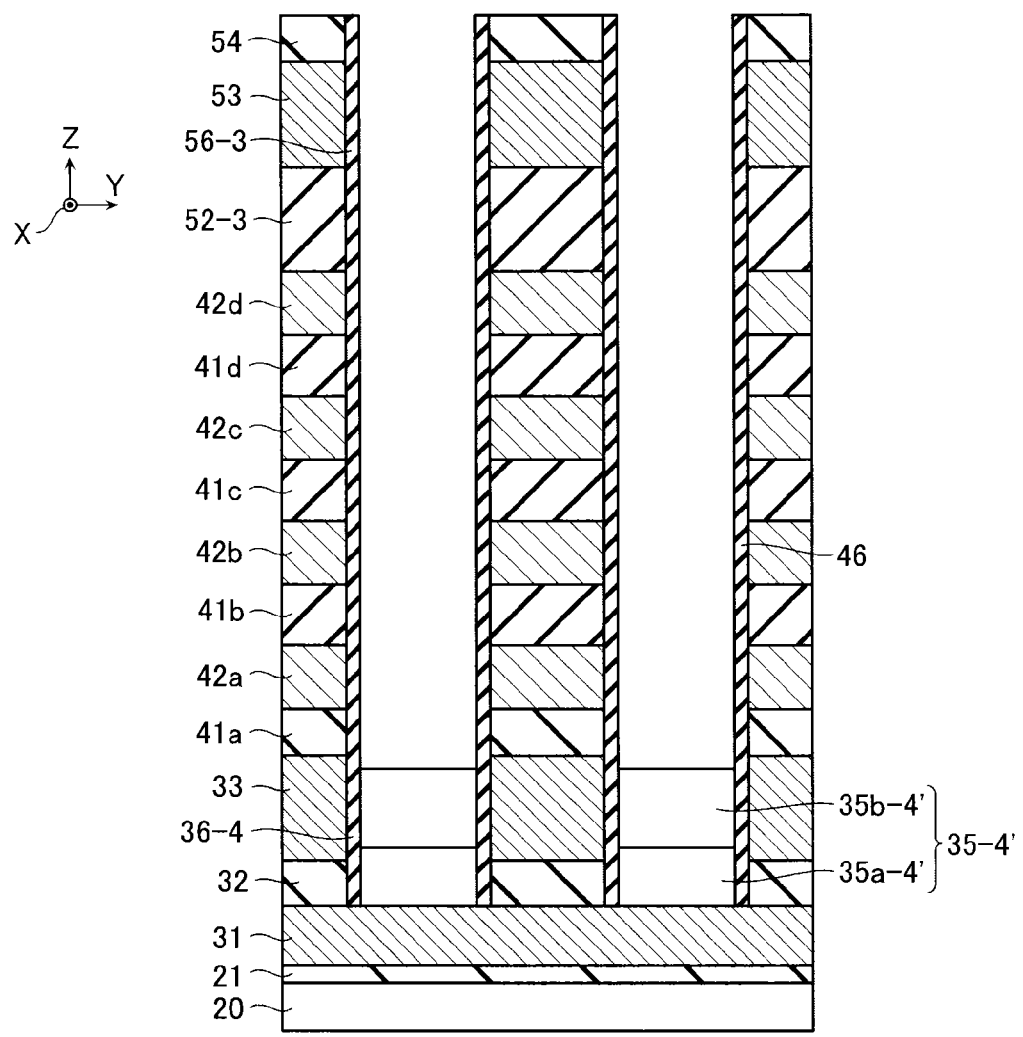
FIG. 45 is an example of a cross-sectional view showing the same manufacturing method.

Next, as shown in FIG. 44, the insulating layer 46' formed on the bottom surface of the trench is removed, and the gate insulating layer 36-4, the rectifier layer 46, and the gate insulating layer 56-3 are formed on the entire side surface of the trench. Next, as shown in FIG. 45, a semiconductor layer 35-4' is deposited so as to fill a lower portion of the trench.

Figure 46:
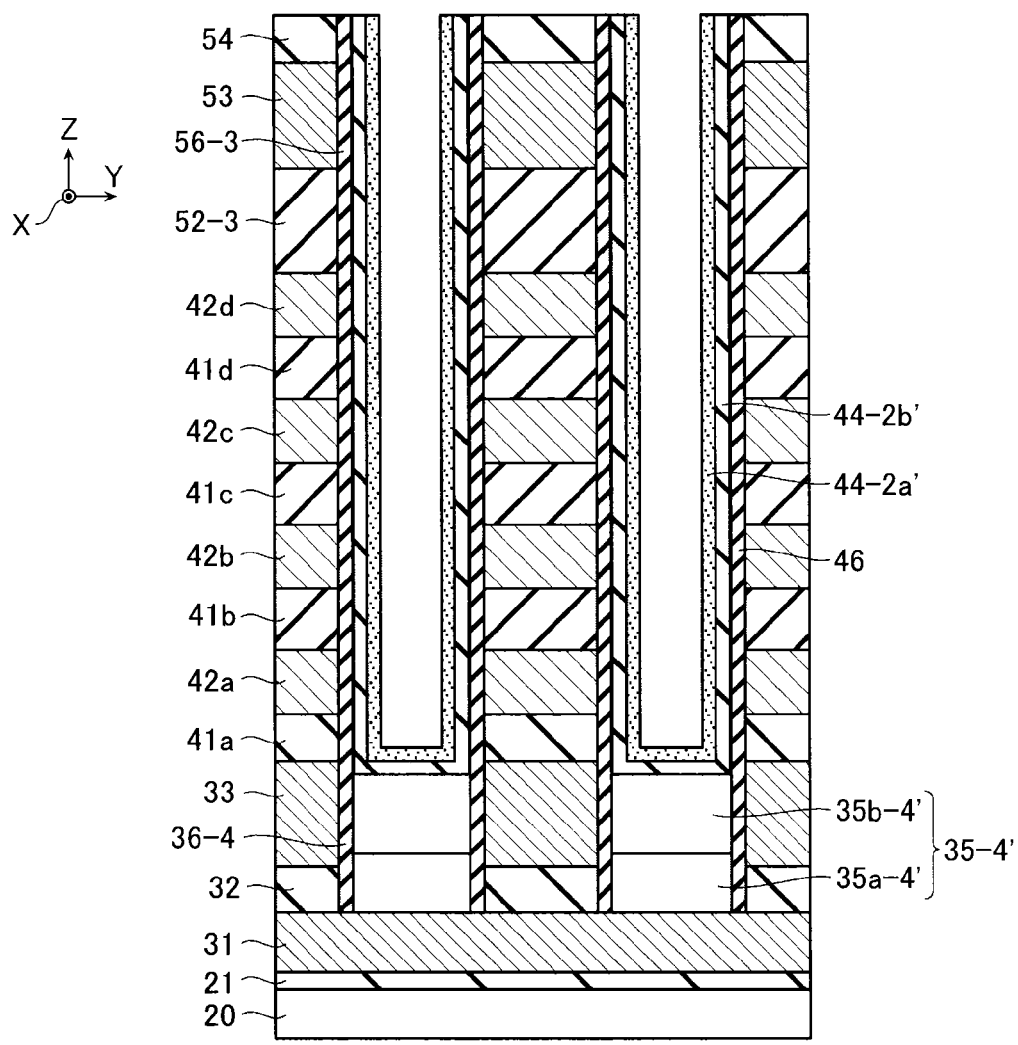
FIG. 46 is an example of a cross-sectional view showing the same manufacturing method.

Next, as shown in FIG. 46, the storage layer 44-2b' and the ion source layer 44-2a' are formed sequentially on the side surfaces and bottom surface of the trench.

Figure 47:
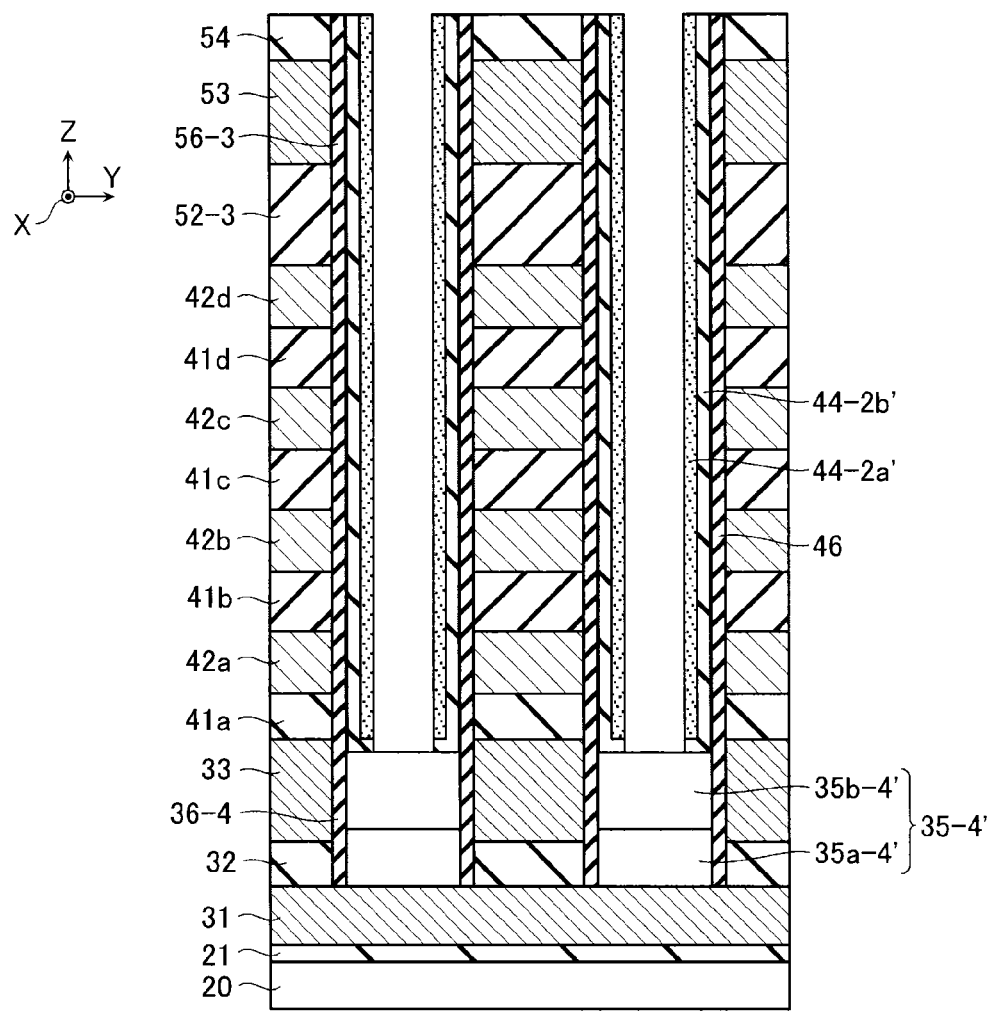
FIG. 47 is an example of a cross-sectional view showing the same manufacturing method.

Next, as shown in FIG. 47, the storage layer 44-2b' and the ion source layer 44-2a' formed on the bottom surface of the trench are removed, and the storage layer 44-2b' and the ion source layer 44-2a' are formed on the entire side surface of the trench via the rectifier layer 46.

Figure 48:
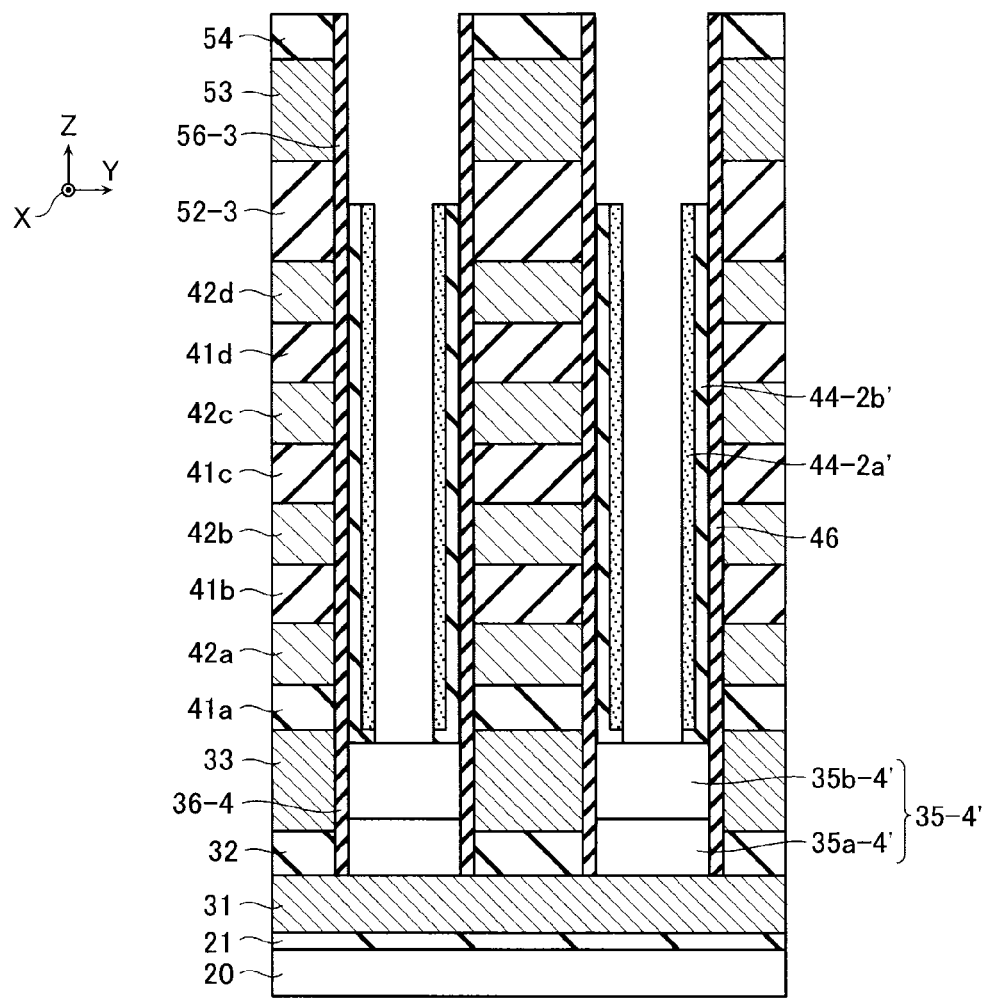
FIG. 48 is an example of a cross-sectional view showing the same manufacturing method.

Next, as shown in FIG. 48, a portion of the storage layer 44-2b' and the ion source layer 44-2a' facing the conductive layer 53 via the gate insulating layer 56-3 is removed by a similar method to in the third embodiment.

Figure 49:
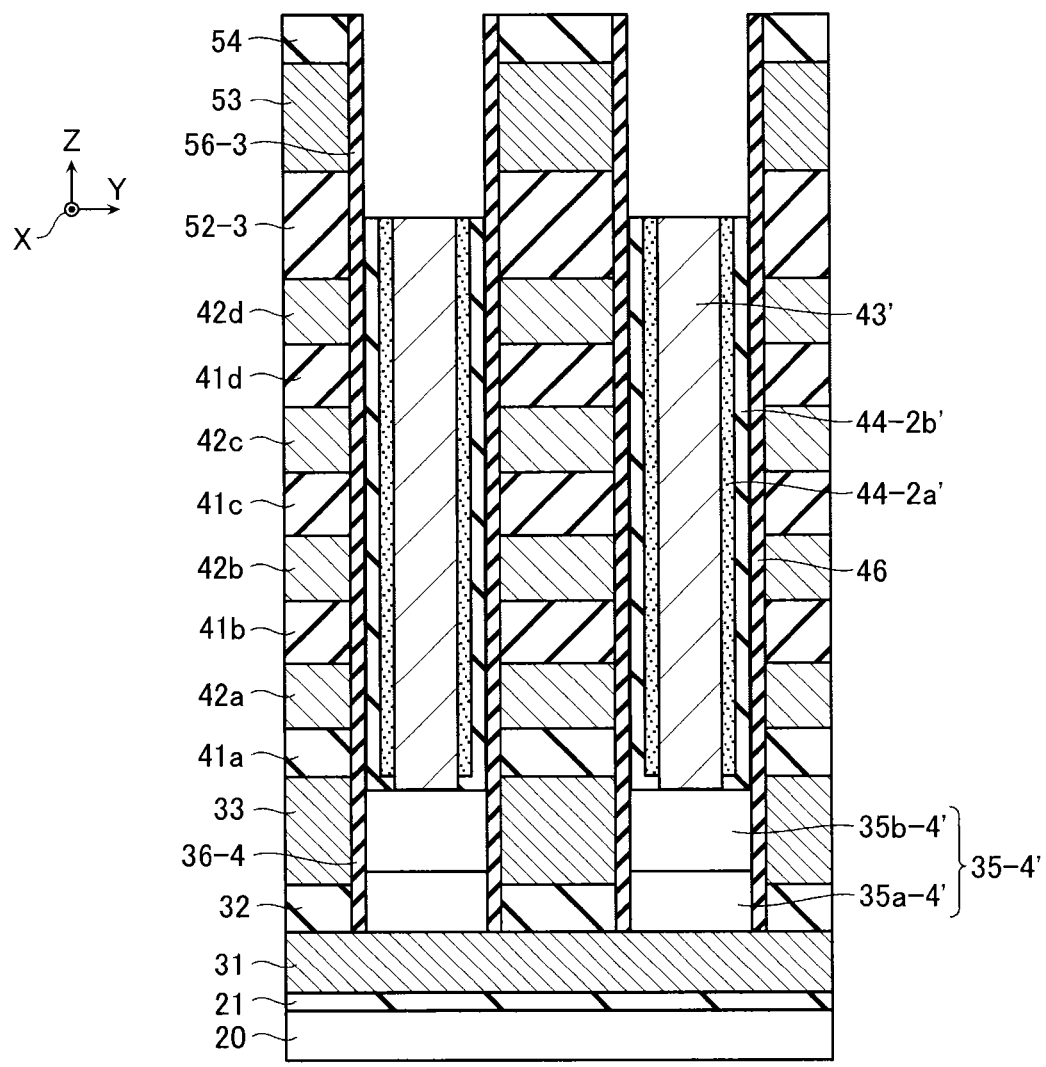
FIG. 49 is an example of a cross-sectional view showing the same manufacturing method.

Next, as shown in FIG. 49, the conductive layer 43' is formed from the bottom surface of the trench to the upper end portion of the ion source layer 44-2a'.

Figure 50:
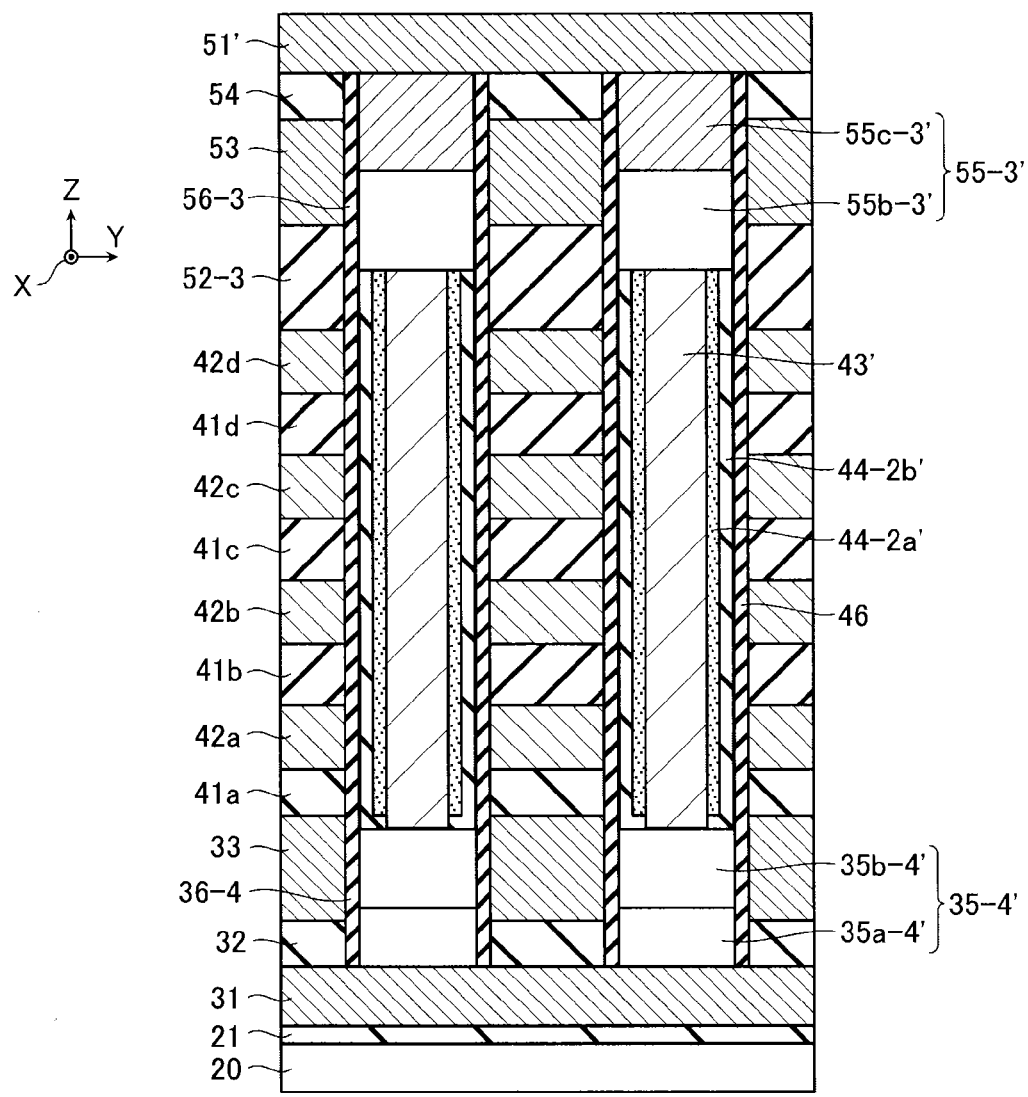
FIG. 50 is an example of a cross-sectional view showing the same manufacturing method.
Figure 51:
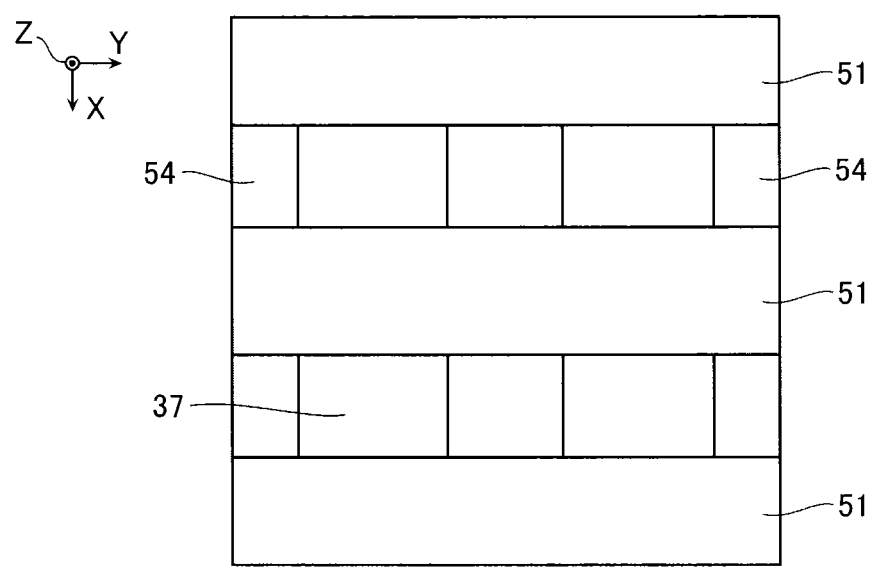
FIG. 51 is an example of a plan view showing the same manufacturing method.

Next, as shown in FIG. 50, the channel layer 55b-3' and the source electrode layer 55c-3' are stacked sequentially on the storage layer 44-2b', the ion source layer 44-2a', and the conductive layer 43', so as to fill the remaining portion of the trench. Next, the conductive layer 51' that extends in a plate-like shape in the X direction and the Y direction is formed on the inter-layer insulating film 54, the gate insulating layer 56-3, and the source electrode layer 55c-3'.

Next, as shown in FIG. 51, trenches that penetrate the semiconductor layer 35-4', the conductive layer 43', the semiconductor layer 55-3', and the conductive layer 51' and that are arranged with a certain pitch in the X direction and extend in the Y direction, are formed. This trench results in the semiconductor layer 35-4', the conductive layer 43', and the channel layer 55b-3' and source electrode layer 55c-3' becoming the semiconductor layer 35-4, the conductive layer 43, and the semiconductor layer 55-3 that extend in a columnar shape in the Z direction, and results in the conductive layer 51' becoming the conductive layers 51 that extend in a striped shape in the Y direction. The above processes result in the memory cell array 11-4 according to the present embodiment being manufactured.

In the present embodiment, RIE processing of the lower select transistor layer 30-4, the memory layer 40-3, and the upper select transistor layer 50-3 is performed in a batch. Therefore, the number of manufacturing steps can be further reduced compared to in the manufacturing method of the semiconductor memory device according to the third embodiment.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of first lines that are arranged in a first direction perpendicular to a surface of a substrate and that are extending in a second direction parallel to the surface of the substrate;
   a plurality of second lines that are arranged in the second direction, that are extending in the first direction, and that intersect the first lines;
   a plurality of memory cells disposed at intersections of the first lines and the second lines;
   a plurality of first select gate transistors each including a first channel line connected to a first end of the second line and a first gate line;
   a first global bit line connected to the first channel lines;
   a plurality of second select gate transistors each including a second channel line connected to a second end of the second line and a second gate line;
   a second global bit line connected to the second channel lines; and
   a control circuit that applies a voltage to the memory cells and that controls the first select gate transistors and the second select gate transistors, wherein
   the control circuit sets one of the first select gate transistor and the second select gate transistor connected to a certain second line to an ON state and the other to an OFF state,
   when the first select gate transistor connected to the certain second line is set to the ON state, the control circuit sets the first select gate transistor connected to the second line other than the certain second line to the OFF state, and sets the second select gate transistor connected to the second line other than the certain second line to the ON state, and when the second select gate transistor connected to the certain second line is set to the ON state, the control circuit sets the first select gate transistor connected to the second line other than the certain second line to the ON state, and sets the second select gate transistor connected to the second line other than the certain second line to the OFF state.

2. The device according to claim 1, wherein the second channel line includes an oxide semiconductor.

3. The device according to claim 2, wherein the first end of the second line is provided on the side of the substrate, and the second end of the second line is provided on the side opposite to the side of the substrate.

4. The device according to claim 1, wherein the memory cells each comprise a stacked film including a silicon oxide film and an ion source metal.

5. The device according to claim 1, further comprising:
a first insulating layer interposed between the first lines and the second lines; and
a second insulating layer interposed between the second channel line and the second gate line,
wherein the first insulating layer and the second insulating layer are formed in an integrated manner.

6. The device according to claim 1, further comprising:
a first insulating layer interposed between the first lines and the second lines;
a second insulating layer interposed between the second channel line and the second gate line; and
a third insulating layer interposed between the first channel line and the first gate line,
wherein the first insulating layer, the second insulating layer, and the third insulating layer are formed in an integrated manner.

7. The device according to claim 1, wherein
when the first select gate transistor connected to the certain second line is set to the ON state, the control circuit sets a voltage of the first global bit line to a setting voltage and a voltage of the second global bit line to a first voltage smaller than the setting voltage,
when the second select gate transistor connected to the certain second line is set to the ON state, the control circuit sets the voltage of the second global bit line to the setting voltage and the voltage of the first global bit line to the first voltage,
the control circuit sets a voltage of a certain first line to a second voltage smaller than the first voltage, and
the control circuit sets a voltage of the first line other than the certain first line to the first voltage.

8. The device according to claim 1, wherein
the control circuit sets the first select gate transistor connected to the certain second line to the ON state and the second select gate transistor connected to the certain second line to the OFF state, and
the control circuit sets the first select gate transistor connected to the second line other than the certain second line to the OFF state, and sets the second select gate transistor connected to the second line other than the certain second line to the ON state.

9. The device according to claim 8, wherein
the control circuit sets a voltage of the first global bit line to a setting voltage,
the control circuit sets a voltage of the second global bit line to a first voltage smaller than the setting voltage,
the control circuit sets a voltage of a certain first line to a second voltage smaller than the first voltage, and
the control circuit sets a voltage of the first line other than the certain first line to the first voltage.

10. The device according to claim 1, wherein
the control circuit sets the second select gate transistor connected to the certain second line to the ON state and the first select gate transistor connected to the certain second line to the OFF state, and
the control circuit sets the first select gate transistor connected to the second line other than the certain second line to the ON state, and sets the second select gate transistor connected to the second line other than the certain second line to the OFF state.

11. The device according to claim 10, wherein
the control circuit sets a voltage of the second global bit line to a setting voltage,
the control circuit sets a voltage of the first global bit line to a first voltage smaller than the setting voltage,
the control circuit sets a voltage of a certain first line to a second voltage smaller than the first voltage, and
the control circuit sets a voltage of the first line other than the certain first line to the first voltage.

12. A semiconductor memory device, comprising:
a plurality of first lines that are arranged in a first direction perpendicular to a surface of a substrate and that are extending in a second direction parallel to the surface of the substrate;
a plurality of second lines that are arranged in the second direction, that are extending in the first direction, and that intersect the first lines;
a plurality of memory cells disposed at intersections of the first lines and the second lines;
a plurality of first select gate transistors each including a first channel line connected to a first end of the second line and a first gate line;
a first global bit line connected to the first channel lines;
a plurality of second select gate transistors each including a second channel line connected to a second end of the second line and a second gate line;
a second global bit line connected to the second channel lines;
a first insulating layer interposed between the first lines and the second lines;
a second insulating layer interposed between the second channel line and the second gate line; and
a third insulating layer interposed between the first channel line and the first gate line,
the second channel line including an oxide semiconductor, and
the first insulating layer, the second insulating layer, and the third insulating layer are formed in an integrated manner.

13. The device according to claim 12, wherein the memory cells each comprise a stacked film of a silicon oxide film and an ion source metal.

14. The device according to claim 12, wherein:
the first and second insulating layers are connected to each other, the first and third insulating layers are connected to each other, and the first to third insulating layers comprise the same material.

15. The device according to claim 12, wherein,
the second channel line includes InO, ZnO, GaO, InGaZnO, CuO or TiO as the oxide semiconductor.

16. The device according to claim 12, wherein
the first end of the second line is provided on the side of the substrate, and the second end of the second line is provided on the side opposite to the side of the substrate.

17. A semiconductor memory device, comprising:
a plurality of first lines that are arranged in a first direction perpendicular to a surface of a substrate and that are extending in a second direction parallel to the surface of the substrate;
a plurality of second lines that are arranged in the second direction, that are extending in the first direction, and that intersect the first lines;
a plurality of memory cells disposed at intersections of the first lines and the second lines;
a plurality of first select gate transistors each including a first channel line connected to a first end of the second line and a first gate line;
a first global bit line connected to the first channel lines;
a plurality of second select gate transistors each including a second channel line connected to a second end of the second line and a second gate line;
a second global bit line connected to the second channel lines;
a first insulating layer interposed between the first lines and the second lines;
a second insulating layer interposed between the second channel line and the second gate line; and
a third insulating layer interposed between the first channel line and the first gate line,
the memory cells each comprise a stacked film including a silicon oxide film and an ion source metal, and
the first insulating layer, the second insulating layer, and the third insulating layer are formed in an integrated manner.

18. The device according to claim 17, wherein
the ion source metal includes silver (Ag) as the ion source metal.

19. The device according to claim 17, wherein
the first and second insulating layers are connected to each other, and the first and third insulating layers are connected to each other, and the first to third insulating layers comprise the same material.

20. A semiconductor memory device, comprising:
a plurality of first lines that are arranged in a first direction perpendicular to a surface of a substrate and that are extending in a second direction parallel to the surface of the substrate;
a plurality of second lines that are arranged in the second direction, that are extending in the first direction, and that intersect the first lines;
a plurality of memory cells disposed at intersections of the first lines and the second lines;
a plurality of first select gate transistors each including a first channel line connected to a first end of the second line and a first gate line;
a first global bit line connected to the first channel lines;
a plurality of second select gate transistors each including a second channel line connected to a second end of the second line and a second gate line;
a second global bit line connected to the second channel lines;
a first insulating layer interposed between the first lines and the second lines;
a second insulating layer interposed between the second channel line and the second gate line; and
a third insulating layer interposed between the first channel line and the first gate line,
the second channel line including an oxide semiconductor, and
the first and second insulating layers are connected to each other, and the first and third insulating layers are connected to each other, and the first to third insulating layers comprise the same material.

21. The device according to claim 20, wherein,
the second channel line includes InO, ZnO, GaO, InGaZnO, CuO or TiO as the oxide semiconductor.

22. The device according to claim 20 wherein
the first end of the second line is provided on the side of the substrate, and the second end of the second line is provided on the side opposite to the side of the substrate.

23. A semiconductor memory device, comprising:
a plurality of first lines that are arranged in a first direction perpendicular to a surface of a substrate and that are extending in a second direction parallel to the surface of the substrate;
a plurality of second lines that are arranged in the second direction, that are extending in the first direction, and that intersect the first lines;
a plurality of memory cells disposed at intersections of the first lines and the second lines;
a plurality of first select gate transistors each including a first channel line connected to a first end of the second line and a first gate line;
a first global bit line connected to the first channel lines;
a plurality of second select gate transistors each including a second channel line connected to a second end of the second line and a second gate line;
a second global bit line connected to the second channel lines;
a first insulating layer interposed between the first lines and the second lines;
a second insulating layer interposed between the second channel line and the second gate line; and
a third insulating layer interposed between the first channel line and the first gate line,
the memory cells each comprise a stacked film including a silicon oxide film and an ion source metal, and
the first and second insulating layers are connected to each other, and the first and third insulating layers are connected to each other, and the first to third insulating layers comprise the same material.

24. The device according to claim 23, wherein,
the ion source metal includes silver (Ag) as the ion source metal.

* * * * *